(12) United States Patent
Wakui et al.

(10) Patent No.: US 9,031,310 B2
(45) Date of Patent: May 12, 2015

(54) CONDUCTIVE FILM MANUFACTURING METHOD, CONDUCTIVE FILM, AND RECORDING MEDIUM

(75) Inventors: Takashi Wakui, Kanagawa (JP);
Hideyasu Ishibashi, Kanagawa (JP);
Osamu Shimazaki, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 223 days.

(21) Appl. No.: 13/638,541

(22) PCT Filed: Mar. 28, 2011

(86) PCT No.: PCT/JP2011/057582
§ 371 (c)(1),
(2), (4) Date: Sep. 28, 2012

(87) PCT Pub. No.: WO2011/125597
PCT Pub. Date: Oct. 13, 2011

(65) Prior Publication Data
US 2013/0028503 A1    Jan. 31, 2013

(30) Foreign Application Priority Data

Mar. 31, 2010 (JP) ................. 2010-084645
Mar. 31, 2010 (JP) ................. 2010-084647

(51) Int. Cl.
*G06K 9/00* (2006.01)
*H05K 9/00* (2006.01)

(52) U.S. Cl.
CPC .................... *H05K 9/0086* (2013.01)

(58) Field of Classification Search
None
See application file for complete search history.

(56) References Cited

U.S. PATENT DOCUMENTS

| 6,078,274 A * | 6/2000 | Inou ................................ 341/34 |
| 2009/0073085 A1 | 3/2009 | Saneto et al. |
| 2011/0310037 A1 * | 12/2011 | Moran et al. ................. 345/173 |

FOREIGN PATENT DOCUMENTS

| JP | 2009-16700 A | 1/2009 |
| JP | 2009-117683 A | 5/2009 |
| JP | 2009-137455 A | 6/2009 |
| JP | 2009-94467 A | 12/2009 |
| JP | 2009-302439 A | 12/2009 |

OTHER PUBLICATIONS

Taniguchi et al, "A Mura Detection based on the Least Detectable Contrast," 2006, Computer Vision and Graphics, pp. 1024-1030.*
Mizes, "Graininess of Color Halftones," 2000, Conference on Digital Printing Technologies, pp. 1-4.*

* cited by examiner

*Primary Examiner* — Bhavesh Mehta
*Assistant Examiner* — David F Dunphy
(74) *Attorney, Agent, or Firm* — Birch, Stewart, Kolasch & Birch, LLP

(57) ABSTRACT

Disclosed is a method for manufacturing a conductive film in which a mesh pattern comprising a wire material is provided on a base material. Also disclosed are a conductive film and a recording medium. Image data representing a mesh pattern is created on the basis of a plurality of selected positions. On the basis of said image data, an evaluation value which quantifies noise characteristics of the mesh pattern is computed. On the basis of the computed evaluation value and prescribed evaluation conditions, one image datum is chosen as an output image datum.

6 Claims, 33 Drawing Sheets

FIG. 5

| IMAGE DATA GENERATION CONDITION SETTINGS [1/2] | | |
|---|---|---|

WIRE MATERIAL SETTING CONDITIONS 122

TYPE  SILVER (Ag) ▽

FILM MATERIAL SETTING CONDITIONS 126

TYPE  PET FILM ▽

PHYSICAL PROPERTY VALUES (100 μm thickness) 124

| TRANSMITTANCE | 148a |
| REFLECTANCE | 148b |
| COLOR VALUE L* | 148c |
| COLOR VALUE a* | 148d |
| COLOR VALUE b* | 148e |

PHYSICAL PROPERTY VALUES (1 mm thickness) 128

| TRANSMITTANCE | 150a |
| REFLECTANCE | 150b |
| COLOR VALUE L* | 150c |
| COLOR VALUE a* | 150d |
| COLOR VALUE b* | 150e |

MESH PATTERN SETTING CONDITIONS

TOTAL TRANSMITTANCE  93 %  130
FILM THICKNESS  20 μm  132
WIRING WIDTH  20 μm  134
WIRING THICKNESS  10 μm  136

PATTERN SIZE H  5 mm  138
PATTERN SIZE V  5 mm  140
IMAGE RESOLUTION  3500 dpi  142

CANCEL 144     NEXT 146

120

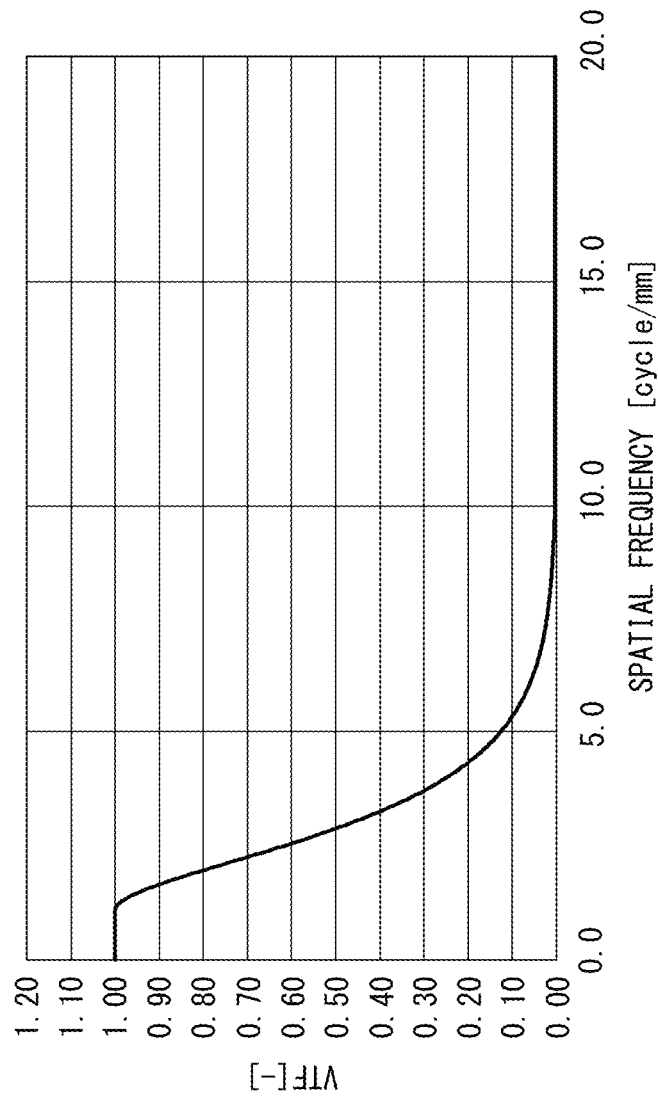

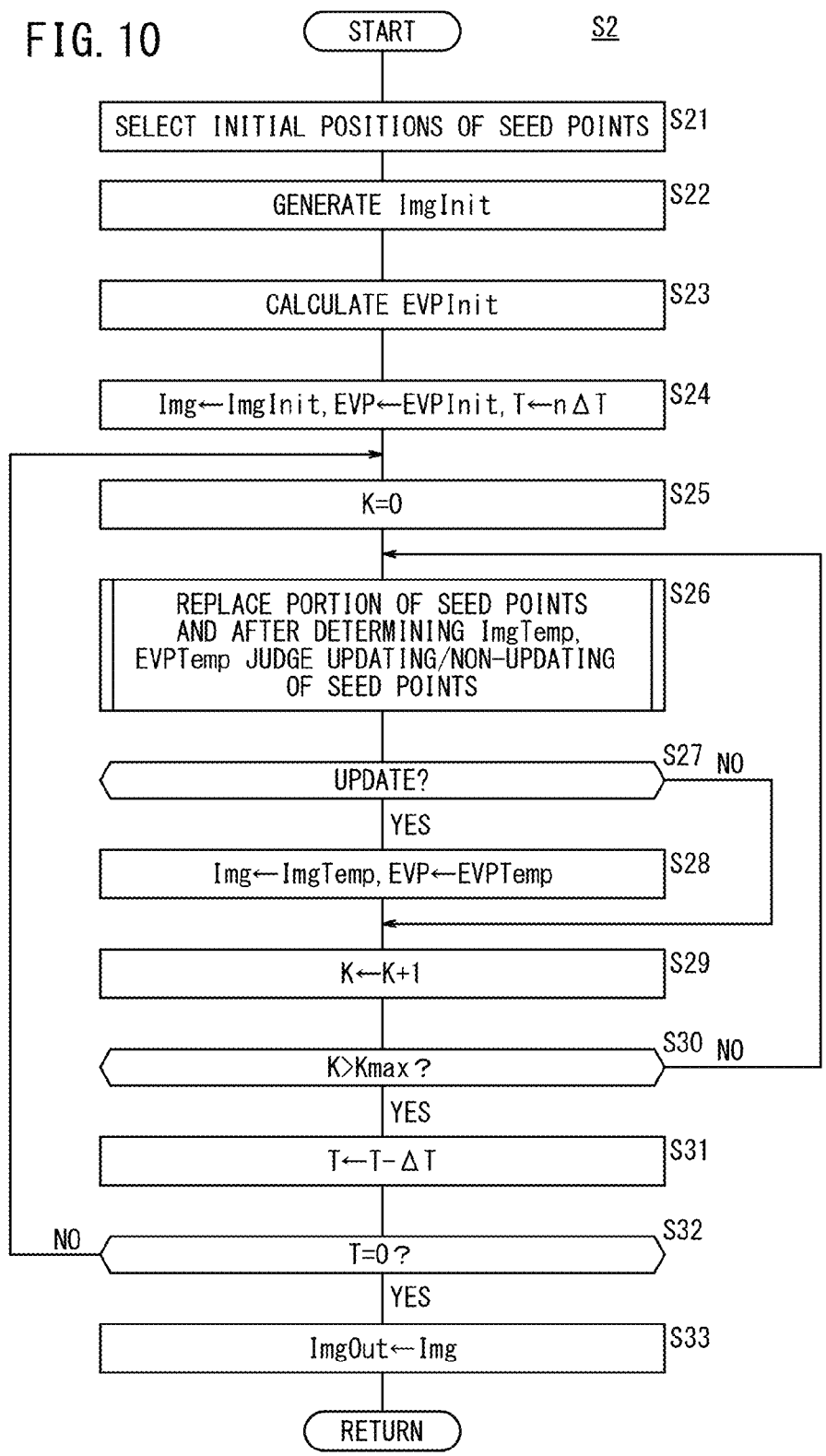

(INITIAL DATA)

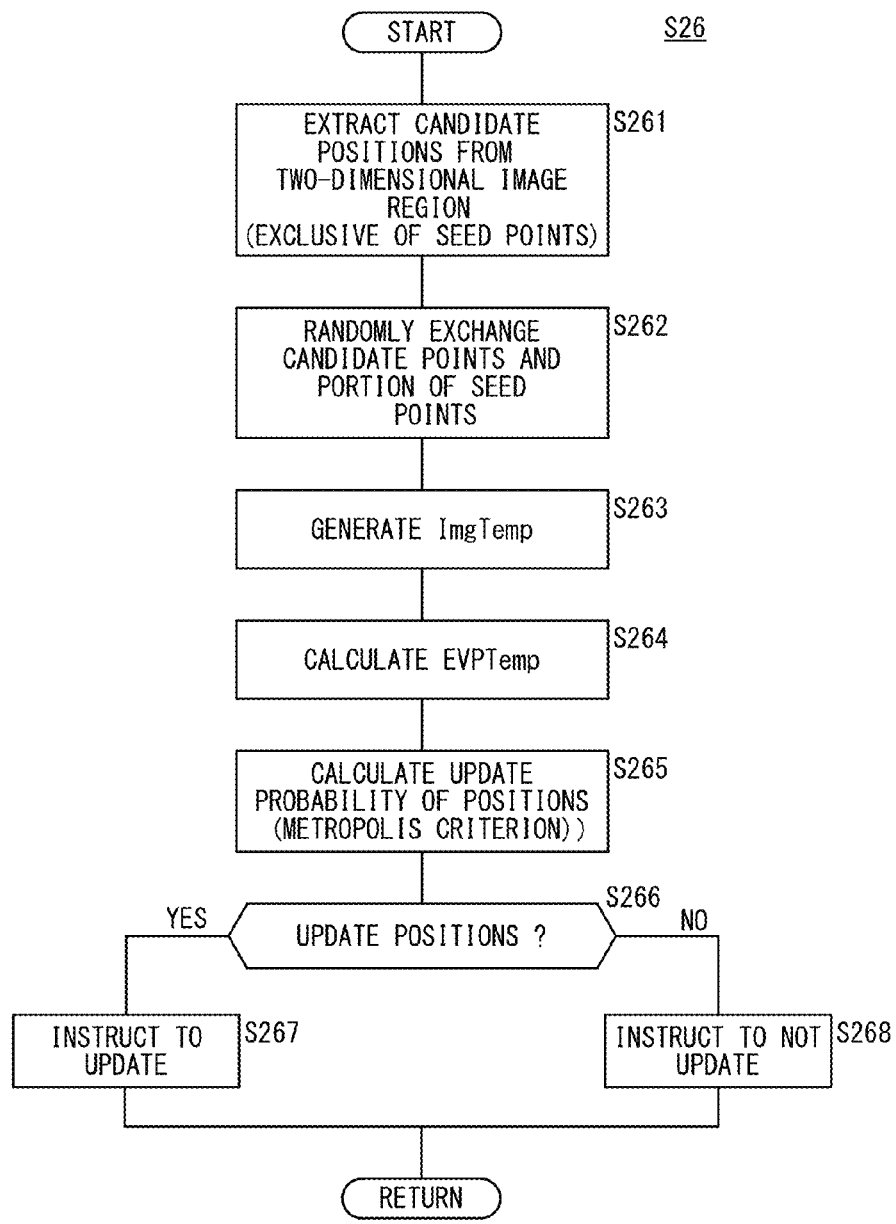

(COMPARATIVE EXAMPLE)
Prior Art (COMPARATIVE EXAMPLE)
Prior Art (COMPARATIVE EXAMPLE)
Prior Art

CONDUCTIVE FILM MANUFACTURING METHOD, CONDUCTIVE FILM, AND RECORDING MEDIUM

TECHNICAL FIELD

The present invention relates to a method (conductive film manufacturing method) for manufacturing a conductive film, in which a mesh pattern made up from wires is disposed on a substrate, as well as the conductive film itself, and a recording medium.

BACKGROUND ART

Recently, a conductive film has been developed in which a mesh pattern made up wires is disposed on a transparent substrate. The conductive film can be used as an electrode or a heat-generating sheet. Not only can such a conductive film be used as an electrode for a touch panel, or an electrode for an inorganic EL element, and organic EL element or a solar cell, but the conductive film may also be applied to a portion of a defroster (defrosting device), a window glass of a vehicle, etc., for example.

Depending on the use of the aforementioned various products, cases are known to occur in which such a mesh pattern produces considerable granular noise, which obstructs the visibility of objects to be observed. Various techniques have been proposed in which, by arranging the same or different mesh patterns in a regular or irregular manner, such granular noise is suppressed, whereby the visibility of objects to be observed can be improved.

For example, in Japanese Laid-Open Patent Publication 2009-094467, an image display device is disclosed having an electromagnetic shielding film and a moire (moiré) preventing film attached thereto, wherein the electromagnetic shielding film has a conductive portion and an opening portion, and the moire preventing film has a moire preventing part (see paragraph [0063], and FIGS. 1, 10A and 10B of the patent publication). As a result of this structure, localized increases of an integrated amount of transmitted light are suppressed, and a nearly constant integrated amount can be realized over the entirety of the film. In other words, by combining the conductive portion and the opening portion, potential formation of mesh patterns is eliminated, making it difficult for moire patterns to occur.

Further, in Japanese Laid-Open Patent Publication 2009-117683, a device and a method are disclosed in which two-dimensional power spectra are calculated respectively in relation to image data representing a pixel array pattern and an electromagnetic wave shielding pattern, and the shape of the electromagnetic wave shielding pattern is determined such that the difference in spatial frequency corresponding to peaks thereof exceeds a predetermined value (see paragraphs [0014] and [0024] of the patent publication). Consequently, generation of moire patterns can be suppressed, whereby an increase in surface resistivity and degradation in transparency can be avoided.

Furthermore, as shown in FIG. 33A, according to Japanese Laid-Open Patent Publication No. 2009-137455, a window for a riding movable body and the shape of a pattern PT1 thereof in plan view are disclosed, having a mesh layer 4, in which rounded arcuate conductive wires 2 from which portions have been cutout are arranged repeatedly in a lattice shape, and respective ends of the arcuate wires 2 are connected to the vicinity of a center portion of another adjacent arcuate wire 2 (see paragraph [0029] and FIG. 3 of the patent publication). In accordance therewith, it is noted that not only visibility but also shielding of electromagnetic waves as well as resistance to breakage can be improved.

Further, as shown in FIG. 33B, according to Japanese Laid-Open Patent Publication No. 2009-016700, a transparent conductive substrate and the shape of a pattern PT2 thereof as viewed in plan are disclosed, which is manufactured using a solution, i.e., a self-organized metal particle solution, which forms a mesh-like structure naturally on the substrate if one side of the substrate is coated and then left untreated (see paragraphs [0022] to [0024] and FIG. 1 of the patent publication). In accordance therewith, it is noted that an irregular mesh-like structure can be obtained in which moire phenomena do not occur.

Moreover, as shown in FIG. 33C, according to Japanese Laid-Open Patent Publication No. 2009-302439, a light transmissive electromagnetic shield material and the shape of a pattern PT3 thereof as viewed in plan are disclosed, in which an electromagnetic shield layer 6 has a sea region structure in a sea-island configuration, wherein the shapes of island regions 8 made up from openings surrounded by the electromagnetic shield layer 6 differ mutually from each other (see paragraphs [0011] to [0015] and FIG. 1(B) of the patent publication). In accordance therewith, it is noted that both optical transparency and electromagnetic shielding are improved without the occurrence of moire patterns.

SUMMARY OF INVENTION

However, with the patterns PT1, PT2 disclosed in Japanese Laid-Open Patent Publication No. 2009-137455 and Japanese Laid-Open Patent Publication No. 2009-16700, there are problems with such pattern configurations in relation to further reducing granular noise and improving visibility.

For example, in the mesh pattern PT1 of Japanese Laid-Open Patent Publication No. 2009-137455, since the arcuate wires 2 are repeatedly arranged in a lattice shape, the periodicity of the wires 2 is extremely high. More specifically, if the power spectrum of the pattern PT1 is calculated, it is predicted that the spatial frequency band corresponding to an inverse of the interval at which the wires 2 are arranged has a sharp peak. In this case, for improving visibility of the pattern PT1, the size (diameter) of the arcs must be made small.

Further, with the mesh shaped pattern PT2 of Japanese Laid-Open Patent Publication No. 2009-016700, since the shape and size of the mesh is uneven, the irregularity thereof is extremely high. More specifically, if the power spectrum of the pattern PT2 is calculated, the power spectrum is predicted to be of a substantially constant value irrespective of the spatial frequency band (close to the characteristics of white noise). For further improving visibility of the pattern PT2, the self-organizational size thereof must be made small.

If this is done, however, in either the window for a riding movable body of Japanese Laid-Open Patent Publication No. 2009-137455 or the transparent conductive substrate of Japanese Laid-Open Patent Publication No. 2009-016700, an inconvenience results in that optical transmittance and productivity are reduced for the purpose of improving visibility.

Furthermore, since the pattern PT3 disclosed in Japanese Laid-Open Patent Publication No. 2009-302439 is not configured in a mesh shape, a variance occurs in the wiring shape of the cutting plane. In the case that the pattern PT3 is used as an electrode, for example, an inconvenience results in that a stable power capability cannot be obtained.

The present invention has been made in order to address and solve the aforementioned problems, and has the object of providing a conductive film and a manufacturing method for a conductive film having a stable power capability even after being cut, which is capable of decreasing granular noise caused by the pattern, while also significantly improving the visibility of objects to be observed. Further, the present invention has the object of providing a recording medium storing a program for enabling a computer to create output image data used in manufacturing such a conductive film.

According to the present invention, a method for manufacturing a conductive film comprises a position selecting step for selecting plural positions from among a predetermined two-dimensional image region, an image data generating step for generating image data representing the pattern of a mesh pattern based on the selected plural positions, an evaluation value calculating step for calculating an evaluation value obtained by quantifying noise characteristics of the mesh pattern based on the generated image data, an image data determining step for determining as output image data one of the image data based on the calculated evaluation value and predetermined evaluation conditions, and a forming step of outputting and forming a wire material on a substrate material based on the determined output image data to thereby manufacture the conductive film having the mesh pattern.

In the foregoing manner, since the evaluation value calculating step for calculating an evaluation value obtained by quantifying noise characteristics of the mesh pattern based on the generated image data, and the image data determining step for determining as output image data one of the image data based on the calculated evaluation value and predetermined evaluation conditions are provided, the form of a mesh pattern having noise characteristics that satisfy the predetermined evaluation conditions can be determined. Stated otherwise, by suitably controlling the noise characteristics of the mesh pattern, the sensation of noise can be reduced.

Further, the method for manufacturing a conductive film may further comprise a structural pattern input step of inputting visual information of the pattern material in relation to visibility of the structural pattern in the case that a pattern material for forming a structural pattern having a pattern different from the pattern of the mesh pattern is superimposed on the conductive film and visual confirmation thereof is performed, and an image information estimating step of estimating image information of the structural pattern based on the input visual information of the pattern material, wherein based on the estimated structural pattern image information, the image data generating step may generate the image data representing a pattern in which the structural pattern is superimposed on the mesh pattern. Owing thereto, while considering an actual mode of use including the structural pattern, noise characteristics can be optimized. In particular, moire patterns generated by the mesh pattern and the structural pattern can be suppressed.

Furthermore, in the visual information, there may be included at least one of a type, a color value, an optical transmittance, and an optical reflectance of the pattern material, and an arrangement position, a unit shape, and a unit size of the structural pattern is included in the visual information of the pattern material.

Further, the pattern material may comprise a black matrix.

Preferably, the method for manufacturing a conductive film further comprises a first input step of inputting visual information of the wire material in relation to the visibility of the mesh pattern, a second input step of inputting visual information of the substrate material in relation to the visibility of the mesh pattern, and an estimating step of estimating image information of the mesh pattern based on the input visual information of the wire material and the substrate material, wherein, in the image data generating step, the image data is generated based on the estimated image information of the mesh pattern.

Further, the evaluation value may be an evaluation value representative of a degree of granularity.

Further, preferably, the evaluation value is an RMS granularity.

Further, preferably, the evaluation value is an RMS granularity corrected by a human visual response characteristic function.

Further, preferably, the human visual response characteristic function is a Dooley-Shaw function.

Further, the corrected RMS granularity may be an RMS granularity calculated using new image data obtained by implementing a filtering process corresponding to the human visual response characteristic function with respect to the image data.

Furthermore, in the image data generating step, a mesh-shaped pattern may be formed from the plural positions using a Delaunay triangulation method, whereby image data representing the pattern is created.

Furthermore, in the image data generating step, a mesh-shaped pattern may be formed from the plural positions using a Voronoi diagram, whereby image data representing the pattern is created.

Further, the method for manufacturing a conductive film preferably further comprises a position updating step of respectively updating part of the plural positions with other positions based on the evaluation value, wherein the position updating step, the image data generating step, and the evaluation value calculating step are repeated successively, and the output image data is determined by the image data determining step.

In the position updating step, preferably, the part of the plural positions are updated with the other positions respectively using a simulated annealing method.

A conductive film according to the present invention is manufactured utilizing any of the aforementioned manufacturing methods.

A conductive film according to the present invention includes a mesh pattern comprising a plurality of polygonal meshes, wherein the mesh pattern is formed such that, in relation to a power spectrum of a centroid position distribution of the meshes, an average intensity in a spatial frequency band higher than a predetermined spatial frequency is greater than an average intensity in a spatial frequency band lower than the predetermined spatial frequency.

Further, the predetermined spatial frequency preferably is a spatial frequency at which a human visual response characteristic corresponds to 5% of a maximum response thereof.

Furthermore, the human visual response characteristic may be a visual response characteristic obtained based on a Dooley-Shaw function at a visibility distance of 300 mm, wherein the predetermined spatial frequency is 6 cycle/mm.

According to the present invention, there is provided a recording medium storing a program for enabling a computer to create output image data for use in manufacturing a conductive film, wherein the program further enables the computer to function as a position selecting unit for selecting plural positions from among a predetermined two-dimensional image region, an image data generating unit for generating image data representing the pattern of a mesh pattern based on the plural positions selected by the position selecting unit, an evaluation value calculating unit for calculating an evaluation value obtained by quantifying noise characteristics of the mesh pattern based on the image data generated by the image data generating unit, and an image data determining unit for determining as output image data one of the image data based on the evaluation value calculated by the evaluation value calculating unit and predetermined evaluation conditions.

According to the conductive film manufacturing method, the conductive film, and the storage medium of the present invention, image data representative of the pattern of a mesh pattern is generated based on the plural selected positions, an evaluation value is calculated by quantifying noise characteristics of the mesh pattern based on the generated image data, and one of the plural image data is determined as output image data based on the calculated evaluation value and predetermined evaluation conditions. Therefore, the form of a mesh pattern having noise characteristics that satisfy the predetermined evaluation condition can be determined. Stated otherwise, by optimally controlling the noise characteristics of the mesh pattern, the sensation of noise can be reduced.

According to the conductive film of the present invention, in relation to a power spectrum of a centroid position distribution of respective meshes, a mesh pattern is formed such that an average intensity in a spatial frequency band higher than a predetermined spatial frequency is greater than an average intensity in a spatial frequency band lower than the predetermined spatial frequency. Therefore, compared to a low spatial frequency band, the noise level on the side of the high spatial frequency band is relatively large. Although human visual perception has a high response characteristic in a low spatial frequency band, in mid to high spatial frequency bands, properties of the response characteristic decrease rapidly, and thus, the sensation of noise as perceived visually by humans tends to decrease. In accordance with this phenomenon, the sensation of granular noise caused by the pattern of the transparent conductive film is capable of being lowered, and the visibility of objects to be observed can be significantly enhanced. Further, because a plurality of polygonal meshes are provided, the cross sectional shape of the respective wires after cutting is substantially constant, and thus the conductive film exhibits a stable conducting capability.

BRIEF DESCRIPTION OF DRAWINGS

FIG. 5 is a view showing a first setting screen for setting image data creating conditions;

FIG. 9 is a graph of a Dooley-Shaw function (observational distance of 300 mm);

FIG. 10 is a first flowchart explaining a method of creating output image data;

FIG. 16 is a detailed flowchart of step S26 shown in FIG. 10;

DESCRIPTION OF EMBODIMENTS

Below, with reference to the accompanying drawings, an explanation shall be given of a preferred embodiment in relation to a manufacturing apparatus for carrying out a conductive film manufacturing method according to an embodiment of the present invention.

Figure 1:
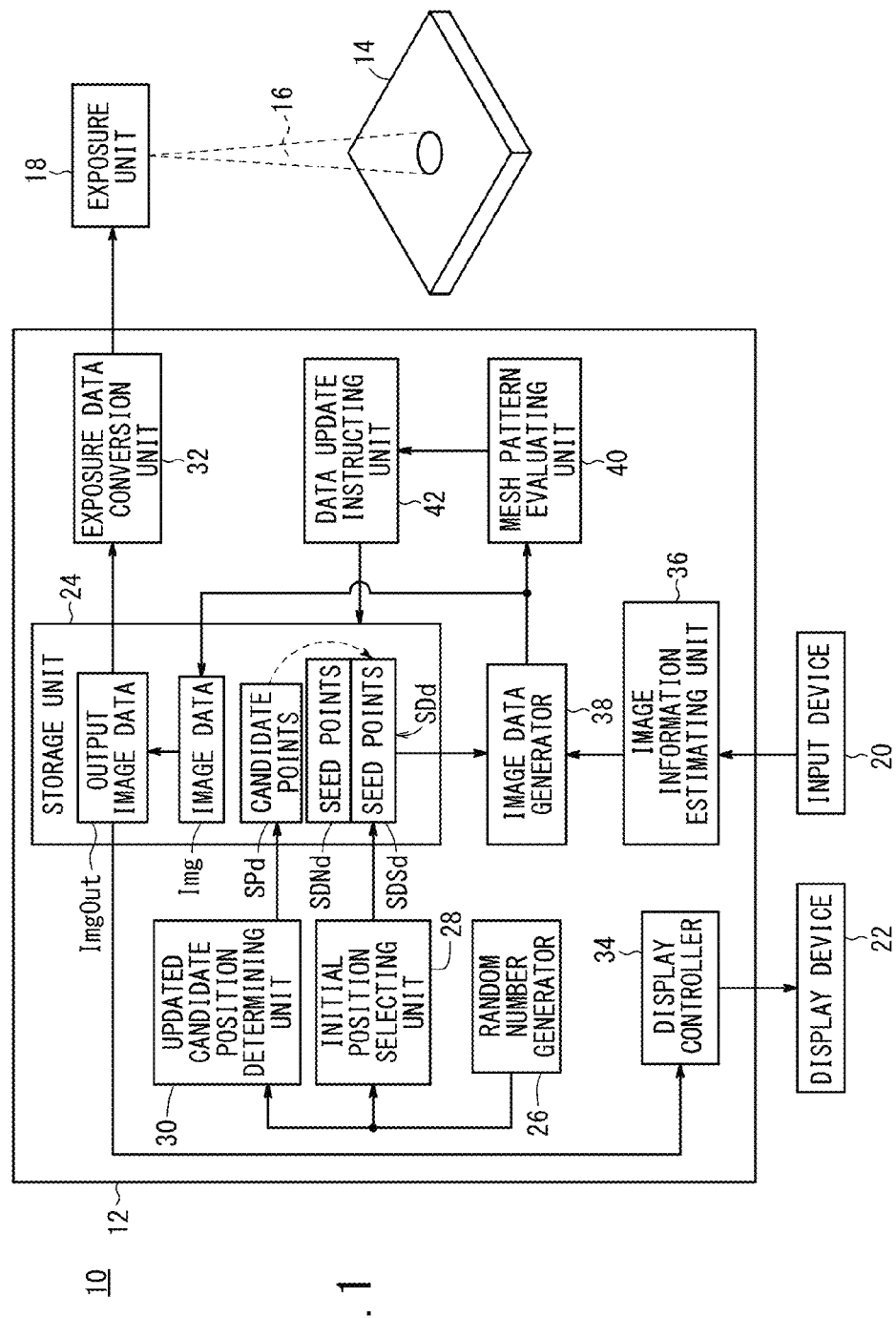
FIG. 1 is an outline schematic block diagram of a manufacturing apparatus for manufacturing a conductive film according to an embodiment of the present invention.

FIG. 1 is an outline schematic block diagram of a manufacturing apparatus 10 for manufacturing a conductive film 14 according to the present embodiment.

The manufacturing apparatus 10 basically comprises an image processing device 12 for creating image data Img (including output image data ImgOut) representative of a pattern corresponding to a mesh pattern M, an exposure unit 18 for performing exposure by illuminating the conductive film 14 with light 16 under a manufacturing process based on the output image data ImgOut created by the image processing device 12, an input device 20 for inputting to the image processing device 12 each of various conditions (including visual information of a mesh pattern M and a later-described structural pattern) for creating the image data Img, and a display device 22 for displaying a GUI image to assist in an input operation by the input device 20, and for displaying stored output image data ImgOut or the like.

The image processing device 12 comprises a storage unit 24 storing therein image data Img, output image data ImgOut, position data SPd of candidate points SP, and position data SDd of seed points SD, a random number generator 26 for producing a pseudo-random number and generating a random number value, an initial position selecting unit 28 (position selecting unit) for selecting initial positions of seed points SD from among a predetermined two-dimensional image using the random number value generated by the random number generator 26, an updated candidate position determining unit 30 (position selecting unit) for determining positions (excluding positions of the seed points SD) of candidate points SP from among the two-dimensional image region using the random number value, an exposure data conversion unit 32 for converting output image data ImgOut into a control signal (exposure data) of the exposure unit 18, and a display controller 34 for controlling display of respective images on the display device 22.

The seed points SD are made up from first seed points SDN that are not to be updated, and second seed point SDS that are to be updated. Stated otherwise, the position data SDd of the seed points SD are constituted from position data SDNd of the first seed points SDN, and position data SDSd of the second seed points SDS.

A non-illustrated controller, which is constituted by a CPU or the like, is capable of implementing all of the controls in relation to image processing, by reading and executing a program stored in a recording medium (a non-illustrated ROM or the storage unit 24).

The image processing device 12 further comprises an image information estimating unit 36 for estimating image information of a mesh pattern M or a structural pattern based on visual information (described later) input from the input device 20, an image data generating unit 38 for generating image data Img representative of a pattern corresponding to the mesh pattern M or the structural pattern based on image information supplied from the image information estimating unit 36 and positions of seed points SD supplied from the storage unit 24, a mesh pattern evaluating unit 40 that calculates an evaluation value EVP for evaluating a mesh-shaped pattern based on the image data Img created by the image data generating unit 38, and a data update instructing unit 42 for instructing updating/non-updating of data of seed points SD, evaluation values EVP, etc. based on the evaluation value EVP calculated by the mesh pattern evaluating unit 40.

Figure 2A:
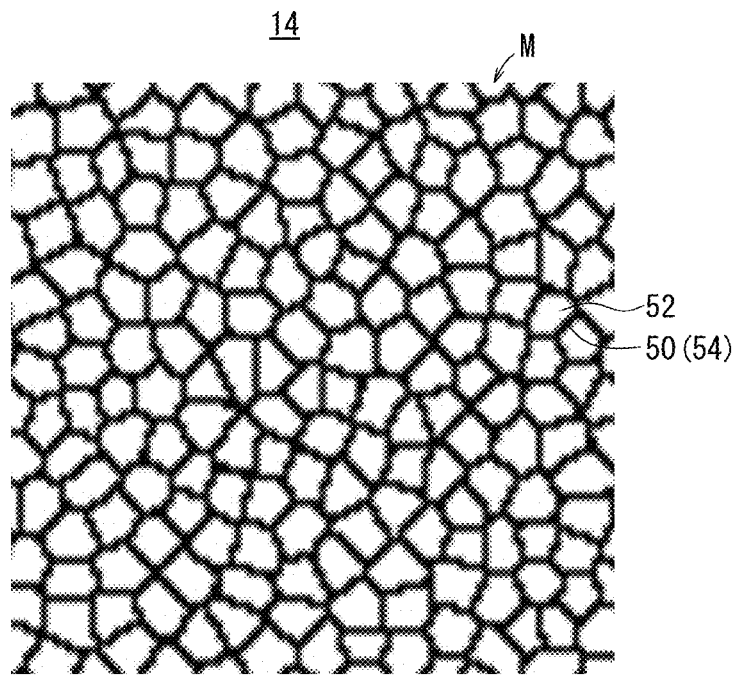
FIG. 2A is a partially enlarged plan view of the conductive film of FIG. 1.

As shown in FIG. 2A, the conductive film 14 of FIG. 1 includes a plurality of conductive portions 50 and a plurality of openings 52. The plural conductive portions 50 form a mesh pattern M (mesh-shaped wirings) in which a plurality of thin wires 54 mutually intersect. More specifically, a mesh shape is formed by a combination of one of the openings 52 and at least two conductive portions 50 that surround the one opening 52. In the mesh shape, each of the openings 52 differs from the others, the openings 52 being arrayed irregularly (i.e., aperiodically) respectively. Below, at times, the material constituting the conductive portion 50 is referred to as a "wire material".

The line width of the metallic thin wires 54 can be selected to be from 5 μm or greater to 200 μm (0.2 mm) or less. Of course, if it is desired to increase light-transmittance, the line width may be selected from between 5 μm or greater to 50 μm or less. Further, the area of the openings 52 preferably is from 0.02 $mm^2$ or greater to 40 $mm^2$ or less, and more preferably, is from 0.1 $mm^2$ or greater to 1 $mm^2$ or less.

Due to being constituted in the foregoing manner, a total optical transmittance of the conductive film 14 can be realized, which is from 70% or greater to less than 99%, from 80% or greater to less than 99%, and from 85% or greater to less than 99%.

Figure 3:
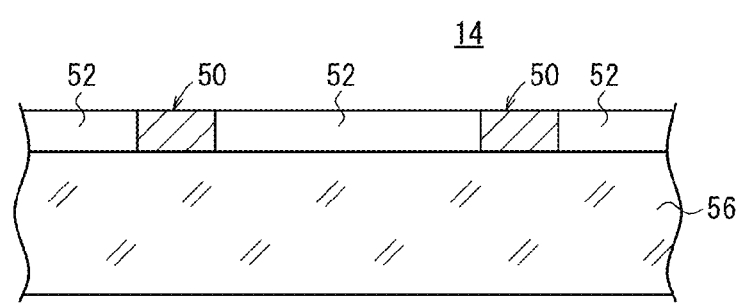
FIG. 3 is an outline cross sectional view of the conductive film of FIG. 2A.

The conductive film 14 is a conductive film that can be used as an electrode for a touch panel, or as an electrode for an inorganic EL element, an organic EL element or a solar cell. As shown in FIG. 3, the conductive film 14 comprises a transparent film substrate 56 (substrate), as well as the conductive portions 50 and the openings 52, which are formed on the transparent film substrate 56.

Figure 2B:
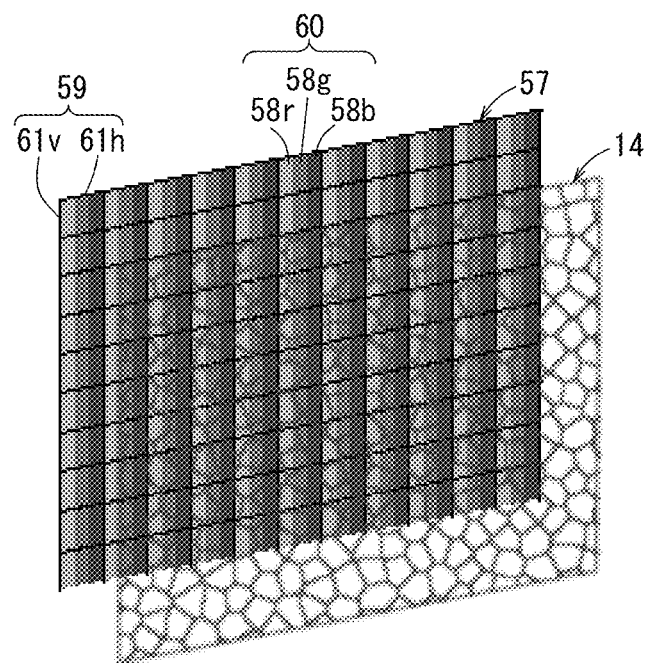
FIG. 2B is an outline exploded perspective view showing a structural example of a case in which the conductive film of FIG. 1 is applied to a touch panel.

An outline exploded perspective view of a case in which the conductive film 14 is used as a touch panel electrode is shown in FIG. 2B. A filter member 57 having the same size as the conductive film 14 is arranged by being superimposed on a surface of the conductive film 14. The filter member 57 comprises a plurality of red filters 58r, a plurality of green filters 58g, and a plurality of blue filters 58b, and a black matrix 59 (structural pattern). Below, the material constituting the black matrix 59 may also be referred to as a "pattern material".

The red filters 58r (the green filters 58g, or the blue filters 58b) are arranged respectively in parallel in a vertical (up/down) direction of the filter member 57. Further, the red filters 58r, the green filters 58g, the blue filters 58b, the red filters 58r, . . . , are arranged in series periodically in a lateral (left/right) direction of the filter member 57. More specifically, a planar region in which one red filter 58r, one green filter 58g, and one blue filter 58b are arranged is constituted as a unit pixel 60 capable of displaying any arbitrary color through a combination of red light emission, green light emission, and blue light emission.

The black matrix 59 has the function of a light shielding material for preventing mixing of reflective light from the exterior, or transmissive light from a non-illustrated back light at each of the adjacent unit pixels 60. The black matrix 59 is made up from light shielding materials 61h extending in a horizontal direction, and light shielding materials 61v extending in a vertical direction. The light shielding materials 61h, 61v form a rectangular lattices, which each surrounds one set of color filters (i.e., the red filter 58r, the green filter 58g, and the blue filter 58b) that constitutes one unit pixel 60.

Further, the conductive film 14 also functions as a transparent heating element for generating heat upon flow of a current therethrough. In this case, first and second electrodes are formed at opposing ends of the conductive film 14, and a current flows from the first electrode to the second electrode. Consequently, the transparent heating element generates heat, whereby an object to be heated (e.g., a building glass window, an automotive glass window, a front cover for a vehicle lamp, etc.), which is placed in contact with or incorporating therein the transparent heating element, is heated. As a result, snow or the like adhering to the object to be heated can be removed.

Figure 4:
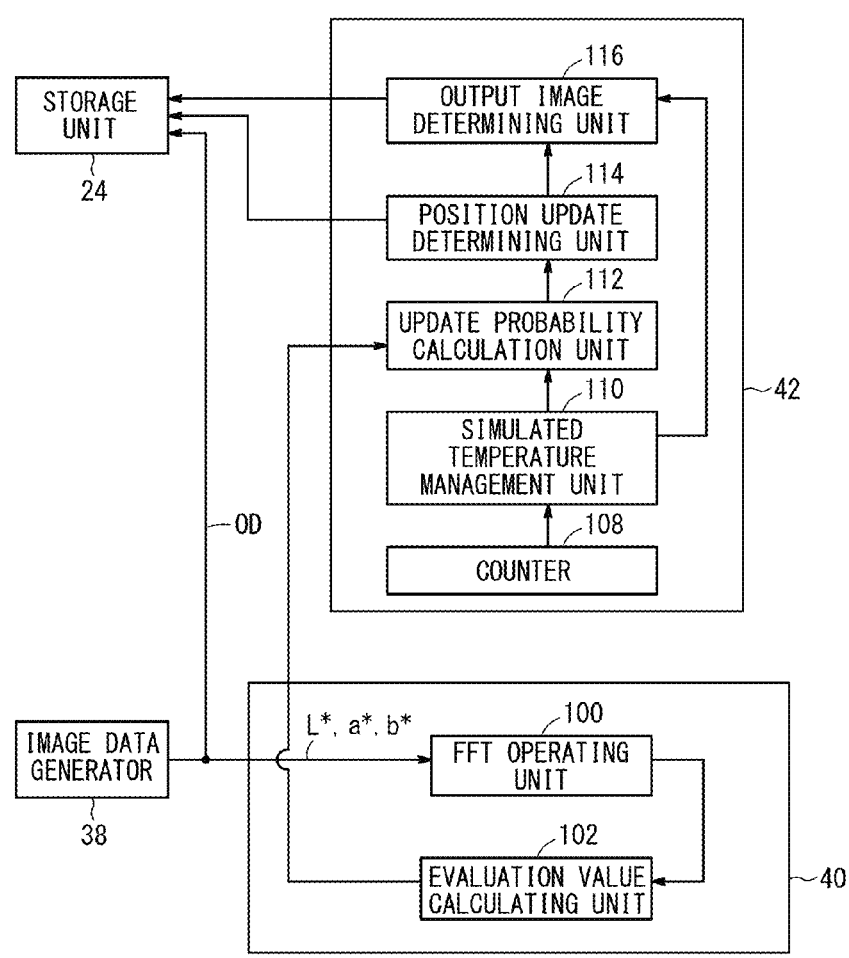
FIG. 4 is a functional block diagram of a mesh pattern evaluating unit and a data update instructing unit shown in FIG. 1.

FIG. 4 is a functional block diagram of the mesh pattern evaluating unit 40 and the data update instructing unit 42 shown in FIG. 1.

The mesh pattern evaluating unit 40 comprises an FFT operating unit 100, which carries out fast Fourier transformation (hereinafter also referred to as FFT) on the image data supplied from the image data generating unit 38 to obtain two-dimensional spectral data (hereinafter referred to as a "spectrum Spc"), and an evaluation value calculating unit 102 for calculating an evaluation value EVP based on the spectra Spc supplied from the FFT operating unit 100.

The data update instructing unit 42 comprises a counter 108 for counting the number of evaluations performed by the mesh pattern evaluating unit 40, a simulated temperature management unit 110 for managing values of simulated temperatures T utilized by a later-described simulated annealing method, an update probability calculation unit 112 for calculating an update probability of the seed points SD based on the evaluation value EVP supplied from the mesh pattern evaluating unit 40 and a simulated temperature T supplied from the simulated temperature management unit 110, a position update determining unit 114 for determining whether to update or not update position data SDd of seed points SD based on the update probability supplied from the update probability calculation unit 112, and an output image data determining unit 116 for determining, as output image data ImgOut, one of the image data Img corresponding to a notification from the simulated temperature management unit 110.

FIG. 5 is a view showing a first setting screen 120 for setting image data generating conditions.

The setting screen 120 comprises, from the top thereof and in the following order, a left side pull down menu 122, a left side display column 124, a right side pull down menu 126, a right side display column 128, seven text boxes 130, 132, 134, 136, 138, 140, 142, and buttons 144, 146 labeled "CANCEL" and "NEXT" respectively.

To the left of the pull down menus 122 and 126, text is displayed indicating "TYPE". By operating the input device 20 (e.g., a mouse), non-illustrated selection columns are displayed below the pull down menus 122, 12, to enable the items displayed therein to be selected.

The display column 124 is made up from five respective columns 148a, 148b, 148c, 148d, 148e with text labels "TRANSMITTANCE", "REFLECTANCE", "COLOR VALUE L*", "COLOR VALUE a*" and "COLOR VALUE b*" displayed respectively to the left thereof.

Similar to the display column 124, the display column 128 is made up from five respective columns 150a, 150b, 150c, 150d, 150e with text labels "REFLECTANCE", "TRANSMITTANCE", "COLOR VALUE L*", "COLOR VALUE a*" and "COLOR VALUE b*" displayed respectively to the left thereof.

The label "TOTAL TRANSMITTANCE" is displayed to the left of the text box 130, and "%" is displayed on the right hand side thereof. The label "FILM THICKNESS" is displayed to the left of the text box 132, and "μm" is displayed on the right hand side thereof. The label "WIRING WIDTH" is displayed to the left of the text box 134, and "μm" is displayed on the right hand side thereof. The label "WIRING THICKNESS" is displayed to the left of the text box 136, and "μm" is displayed on the right hand side thereof. The label "PATTERN SIZE H" is displayed to the left of the text box 138, and "mm" is displayed on the right hand side thereof. The label "PATTERN SIZE V" is displayed to the left of the text box 140, and "mm" is displayed on the right hand side thereof. The label "IMAGE RESOLUTION" is displayed to the left of the text box 142, and "dpi" is displayed on the right hand side thereof.

Further, by performing a predetermined operation using the input device 20 (e.g., keyboard), Arabic numerals can be input into any of the seven text boxes 130, 132, 134, 136, 138, 140, 142.

Figure 6:
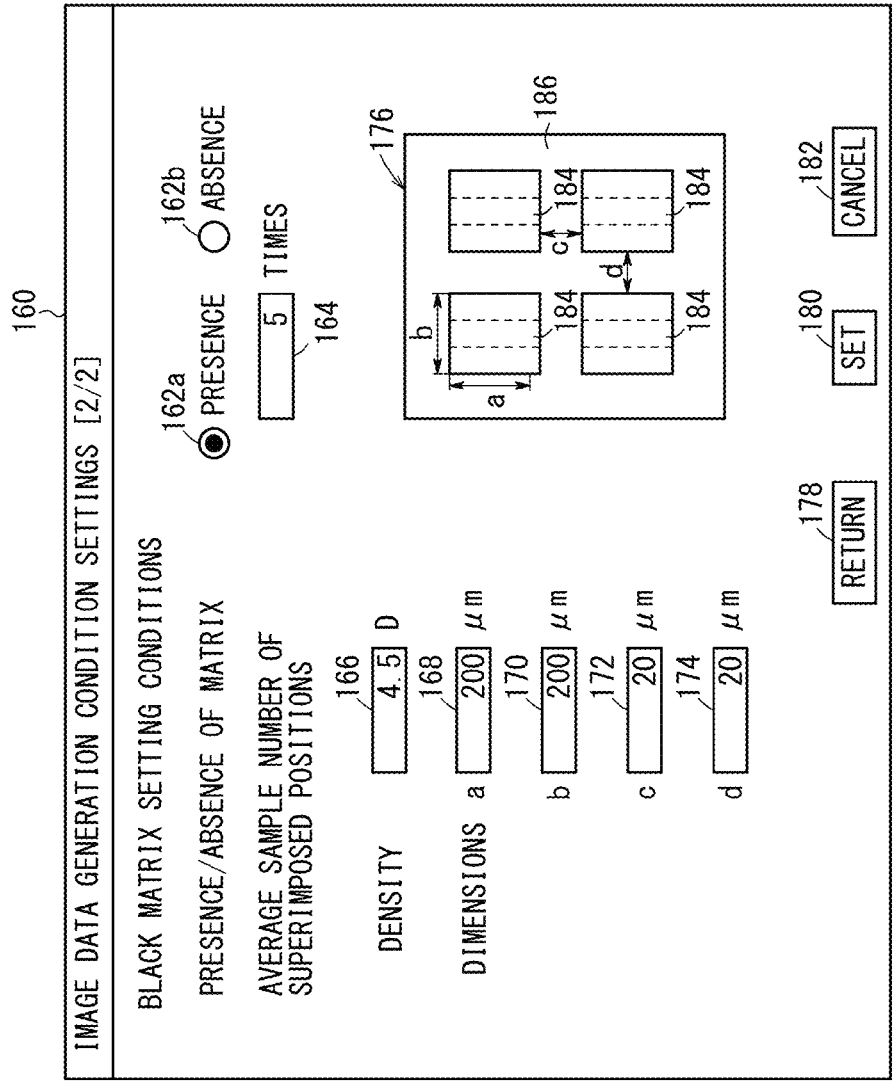
FIG. 6 is a view showing a second setting screen for setting image data creating conditions.

FIG. 6 is a view showing a second setting screen for setting image data generating conditions.

The setting screen 160 has, from the top thereof and in the following order, two radio buttons 162a, 162b, six text boxes 164, 166, 168, 170, 172, 174, a matrix-shaped image 176, and buttons 178, 180, 182 labeled respectively with "RETURN", "SET", and "CANCEL".

The words "PRESENCE" and "ABSENCE" are displayed respectively to the right of the radio buttons 162a and 162b. In addition, to the left of the radio button 162a, the text label "PRESENCE/ABSENCE OF MATRIX" is displayed.

To the left of the text boxes 164, 166, 168, 170, 172, 174, the text labels, "AVERAGE SAMPLE NUMBER OF SUPERIMPOSED POSITIONS", "DENSITY", "DIMENSIONS", "a", "b", "c", and "d" are displayed respectively. Further, to the right of the text boxes 164, 166, 168, 170, 172, 174, the text labels "TIMES", "D", "μm", "μm", "μm", and "μm" are displayed respectively. By performing a predetermined operation using the input device 20 (e.g., a keyboard), Arabic numerals can be entered in any of the text boxes 164, 166, 168, 170, 172, 174.

The matrix-shaped image 176 is an image that simulates the form of the black matrix 59, and is provided with four openings 184 and a window frame 186.

Operations of the manufacturing apparatus 10 constructed basically as described above will be described below with reference to the flowchart of FIG. 7.

Initially, a method of creating a first mesh pattern M1 suitable under conditions in which a black matrix 59 is not superimposed will be described. Thereafter, a method of creating a second mesh pattern M2, which is suitable under conditions in which a black matrix 59 is superimposed thereon, will be described while focusing on differences from the case of the mesh pattern M1. Hereinafter, for cases in which the first mesh pattern M1 and the second mesh pattern M2 need not be distinguished from each other, such cases will be indicated simply as "mesh patterns M".

First, various conditions necessary for creating the image data Img representing the pattern corresponding to the mesh pattern M (including the output image data ImgOut) are input (step S1).

The operator inputs appropriate numerical values, etc. via the setting screen 120 (see FIG. 5) shown on the display device 22. As a result, visual information can be input concerning visibility of the mesh pattern M. Visual information of the mesh pattern M is defined by various information that contribute to the shape and optical density of the mesh pattern M, including visual information of the wire material (metallic thin wire 54), and visual information of the transparent substrate (transparent film substrate 56). As visual information of the wire material, there may be included, for example, at least one of the type, color value, optical transmittance, and optical reflectance of the wire material, and the cross sectional shape and thickness of the metallic thin wire 54. As visual information of the transparent substrate, there may be included, for example, at least one of the type, color value, optical transmittance, optical reflectance, and film thickness of the transparent substrate.

In relation to the conductive film 14 to be manufactured, the operator selects one of the types of wire materials using the pull down menu 122. In the example of FIG. 5, "SILVER (Ag)" is selected. Upon selecting one type of wire material, the display column 124 is updated immediately, and predetermined numerical values are newly displayed corresponding to physical properties of the wire material. Values for optical reflectivity (units: %), optical reflectance (unit: %), color value L*, color value a*, color value b* (CIELAB) of silver having a thickness of 100 μm are displayed respectively in the columns 148a, 148b, 148c, 148d, and 148e.

Further, in relation to the conductive film 14 to be manufactured, the operator selects one of the types of film materials (transparent film substrate 56) using the pull down menu 126. In the example of FIG. 5, "PET FILM" is selected. Upon selecting one type of film material, the display column 128 is updated immediately, and predetermined numerical values are newly displayed corresponding to physical properties of the film material. Values for optical reflectivity (units: %), optical reflectance (unit: %), color value L*, color value a*, color value b* (CIELAB) of a 1 mm thickness PET film are displayed respectively in the columns 150a, 150b, 150c, 150d, and 150e.

By selecting the item "MANUAL INPUT" (not shown) via the pull down menus 122, 126, various physical property values can be input directly from the display columns 124, 128.

Furthermore, in relation to the conductive film 14 to be manufactured, the operator enters various conditions of the mesh pattern M respectively using the text box 130, etc.

The values input to the text boxes 130, 132, 134, 136 correspond respectively to total optical transmittance (units: %), film thickness of the transparent film substrate 56 (units: μm), line width of the metallic thin wires 54 (units: μm), and thickness of the metallic thin wires 54 (units: μm).

The values input to the text boxes 138, 140, 142 correspond respectively to the horizontal size of the mesh pattern M, the vertical size of the mesh pattern M, and the image resolution (pixel size) of the output image data ImgOut.

After having finished the input operations on the setting screen 120, the operator clicks the "NEXT" button 146, whereupon the display controller 34 changes the setting screen 120 shown on the display device 22 to the setting screen 160 shown in FIG. 6.

Through the setting screen 160 displayed on the display device 22, the operator respectively inputs each of various conditions of the black matrix 59. Inputs made via the radio buttons 162a, 162b correspond to whether or not the output image data ImgOut, which is representative of the superimposed pattern of the black matrix 59 on the mesh pattern M, is to be created. If "PRESENCE" (radio button 162a) is selected, the black matrix 59 is superimposed, and if "ABSENCE" (radio button 162b) is selected, the black matrix 59 is not superimposed. In the present case, since the black matrix 59 is not intended to be superimposed, the radio button 162b is selected.

Responsive to an operator clicking on the "SET" button 180, the image information estimating unit 36 estimates the image information of the mesh pattern M. Such image information is referred to at the time that the image data Img (including the output image data ImgOut) is created.

For example, based on the vertical size of the mesh pattern M (the value input to the text box 138) and the image resolution of the output image data ImgOut (the value input to the text box 142), the number of pixels in the horizontal direction of the output image data can be calculated, and based on the width of the wiring (the value input to the text box 134) and the image resolution, the number of pixels corresponding to the line width of the metallic thin wires 54 can be calculated.

Further, based on the optical transmittance of the wire material (the value displayed in column 148a) and the thickness of the wires (the value input to the text box 136), the optical transmittance of the metallic thin wires 54 themselves can be estimated. In addition thereto, based on the optical transmittance of the film material (the value displayed in the column 150a) and the film thickness (the value input to the text box 132), the optical transmittance under a condition in which the metallic thin wires 54 are laminated on the transparent film substrate 56 can be estimated.

Furthermore, based on the optical transmittance of the wire material (the value displayed in the column 148a), the optical transmittance of the film material (the value displayed in the column 150a), the total transmittance (the value input to the text box 130), and the width of the wires (the value input to the text box 132), the number of openings 52 can be estimated together with estimating the number of seed points SD. The number of seed points SD may also be estimated responsive to an algorithm which determines regions of the openings 52.

Next, output image data ImgOut is generated for creating the mesh pattern M (step S2).

Prior to describing the method of creating output image data ImgOut, a method of evaluating the image data Img will first be described. In the present embodiment, an evaluation is performed based on an evaluation value EVP obtained by quantifying noise characteristics (e.g., granular noise).

As one example of evaluating noise characteristics, the range of a predetermined region of the image data Img may be determined, and then the RMS (Root Mean Square) may be determined with respect to pixel values within the range of the region. The present embodiment uses an evaluation value EVP that is improved by adopting evaluation of human visual response characteristics.

Figure 8A:
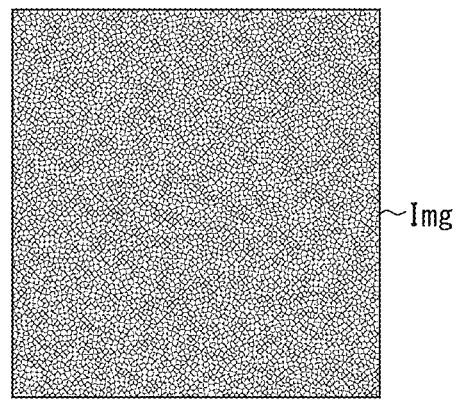
FIG. 8A is an outline schematic diagram in which image data representative of a mesh pattern are made visual.

FIG. 8A is an outline schematic diagram in which image data Img representing the pattern of the mesh pattern M are made visual. Below, the image data Img shall be explained by way of example.

First, FFT is effected on the image data Img shown in FIG. 8A. As a result, concerning the shape of the mesh pattern M, the overall tendency (spatial frequency distribution) thereof can be grasped, rather than a partial shape.

Figure 8B:
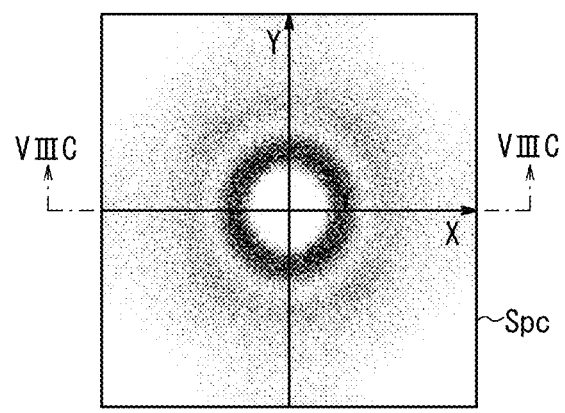
FIG. 8B is a diagram of a two-dimensional power spectrum obtained by implementing a fast Fourier transform on the image data of FIG. 8A.

FIG. 8B is a diagram of a spectrum Spc obtained by implementing FFT on the image data Img of FIG. 8A. The horizontal axis of the spectrum diagram indicates the spatial frequency in the X-axis direction, whereas the vertical axis indicates the spatial frequency in the Y-axis direction. Further, as the displayed density within each spatial frequency band becomes thinner, the intensity level (spectral value) becomes smaller, and as the displayed density becomes denser, the intensity level becomes greater. In the example shown in the diagram, the spectral distribution of the spectrum Spc is isotropic having two annular peaks.

Figure 8C:
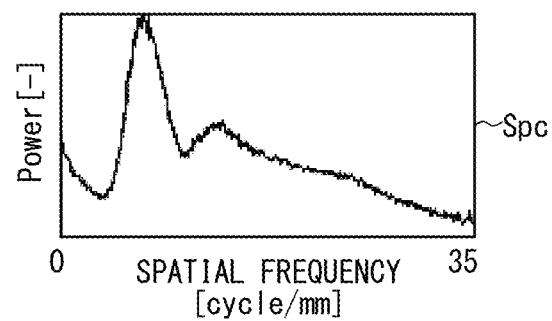
FIG. 8C is a cross sectional view taken along line VIIIC-VIIIC of the two-dimensional power spectrum shown in FIG. 8B.

FIG. 8C is a cross sectional view taken along line VIIIC-VIIIC of the spectrum Spc shown in FIG. 8B. Because the spectrum Spc is isotropic, the cross section thereof corresponds to a radial distribution with respect to all angular directions. As understood from the present drawing, the intensity level becomes small in a low spatial frequency band and in a high spatial frequency band, whereas the intensity level is high only in an intermediate spatial frequency band, thereby exhibiting a so-called band-pass characteristic. More specifically, according to common technical terminology in the field of image engineering, the image data Img shown in FIG. 8A is representative of a pattern having a "green noise" characteristic.

FIG. 9 is a graph of a Dooley-Shaw function viewed at an observational distance of 300 mm.

A Dooley-Shaw function is one type of VTF (Visual Transfer Function), which is a representative function that simulates human visual response characteristics. More specifically, the function corresponds to the square of a luminance contrast ratio characteristic. The horizontal axis on the graph is the spatial frequency (units: cycle/mm), whereas the vertical axis is the value of the VTF (units of which are non-dimensional).

If the observational distance is set at 300 mm, values of the VTF are constant (equivalent to 1) within a range of 0 to 1.0 cycle/mm, and as the spatial frequency grows higher, there is a tendency for the VTF values to decrease. More specifically, the function operates as a low pass filter that blocks or cuts off mid to high spatial frequency bands.

Actual human visual response characteristics exhibit the characteristics of a so-called bandpass filter, in which the value thereof becomes smaller than 1 in the vicinity of 0 cycle/mm. However, as exemplified in FIG. 9, in the present embodiment, by setting the VTF value to 1 even in extremely low spatial frequency bands, the contribution to the evaluation value EVP is high. Consequently, an effect is obtained of suppressing periodicity due to repeated arrangement of the mesh pattern M.

In a case where the value of the spectrum Spc is defined by F(Ux, Uy), the evaluation value EVP is calculated by the following Formula (1).

$$EVP = \left\{ \int_{-Umax}^{Umax} \int_{-Umax}^{Umax} VTF\left(\sqrt{Ux^2 + Uy^2}\right) F(Ux, Uy) dUx dUy \right\}^{\frac{1}{2}} \quad (1)$$

According to the Wiener-Khintchen theorem, the value obtained by integrating the spectrum Spc over the total spatial frequency band matches the square of the RMS. A value obtained by multiplying the VTF with respect to the spectrum Spc, and then integrating the new spectrum Spc over the total spatial frequency band yields an evaluation index that substantially matches human visual characteristics. The evaluation value EVP can be provided by the RMS corrected by the human visual response characteristics. Similar to an ordinary RMS, the evaluation value EVP typically is taken to be a value that is equal to or greater than zero, and the closer the evaluation value EVP is to zero, the better the noise characteristics are.

Further, by effecting an inverse Fourier transform (e.g., IFFT) with respect to the VTF shown in FIG. 9, a mask corresponding to the VTF is calculated in real space, and by applying the mask with respect to image data Img to be evaluated and performing a convolution operation thereon, data Img. Consequently, an operational result can be obtained, which is equivalent to that obtained by the above-described method using formula (1).

It goes without saying the formula for computing the evaluation value EVP may be modified in various ways, responsive to the evaluation function and the target level (acceptable range or tolerance) for determining the mesh pattern M.

Below, a detailed method for determining output image data ImgOut based on the aforementioned evaluation value EVP shall be explained. For example, a method can be used in which generation of image data Img for different patterns, and evaluation thereof by the evaluation value EVP are repeatedly successively.

Included in the image data Img are image data ImgInit, which serve as initial data in the repeated calculations, as well as image data ImgTemp, which serve as temporary data. Further, included in the evaluation value EVP is an evaluation value EVPInit, which serves as an initial value in the repeated calculations, as well as an evaluation value EVPTemp, which serves as temporary data.

In this case, as an optimization problem for determining the output image data ImgOut, various search algorithms can be used, such as a constructive algorithm or an iterative improvement algorithm, etc.

Primarily with reference to the flowchart of FIG. 10 and the functional block diagram of FIG. 1, explanations shall be given concerning an optimization method for optimizing the mesh pattern M by means of a simulated annealing method (hereinafter referred to as an SA method) according to the present embodiment. The SA method is a stochastic search algorithm modeled on an "annealing method" for obtaining robust iron by striking iron in a high temperature condition.

First, the initial position selecting unit 28 selects initial positions of seed points SD (step S21).

Prior to selecting the initial positions, the random number generator 26 generates a random number value using a pseudo-random number generating algorithm. As one such pseudo-random number generating algorithm, any of various algorithms may be used, such as a Mersenne Twister, an SIMD-Oriented Fast Mersenne Twister (SFMT), or an Xorshift method. Then, using the random number value supplied from the random number generator 26, the initial position selecting unit 28 determines initial positions of the seed points SD in a random fashion. Herein, the initial position selecting unit 28 selects initial positions of the seed points SD as pixel addresses in the image data Img, and the seed points SD are set at respective positions that do not overlap one another.

Based on the number of pixels in vertical and horizontal directions of the image data Img supplied from the image information estimating unit 36, the initial position selecting unit 28 determines beforehand the range of the two-dimensional image region. Further, the initial position selecting unit 28 acquires beforehand from the image information estimating unit 36 the number of seed points SD, and based thereon, the number of seed points SD is determined.

Figure 11:
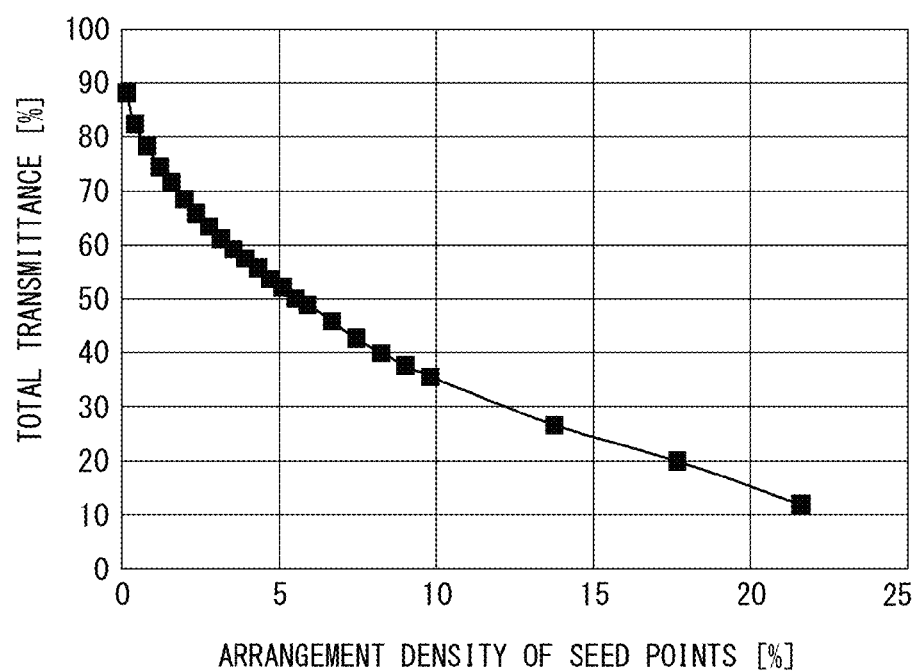
FIG. 11 is a graph showing an example of a relationship between a seed point arrangement density and total transmittance.

FIG. 11 is a graph showing an example of a relationship between an arrangement density of seed points SD and the total transmittance of the mesh pattern M. In the illustrated graph, it is shown that as the arrangement density becomes higher, the coverage area of the wires increases, and as a result, the total transmittance of the mesh pattern decreases.

The graph characteristics exhibit changes responsive to the optical transmittance of the film material (as indicated in the column 150a of FIG. 5), the wiring width (the value input to the text box 132 of FIG. 5), and a region determining algorithm (e.g., a Voronoi diagram). Thus, characteristic data responsive to each of the parameters such as wiring width or the like may be stored beforehand in the storage unit 24, in any of various data formats consisting of functions, tables, or the like.

Further, a correspondence between the arrangement density of the seed points SD and an electrical resistance value of the mesh pattern M may be acquired beforehand, whereby the number of seed points SD may be determined based on a specified electrical resistance value. The electrical resistance value is one parameter indicative of electrical conductivity of the conductive portion 50, which is essential to the design of the mesh pattern M.

The initial position selecting unit 28 may also select the initial positions of the seed points SD without using a random number value. For example, the initial positions can be determined by referring to data acquired from an external apparatus including a non-illustrated scanner or storage device. Such data, for example, may be predetermined binary data, and more specifically, may be halftone data used for printing.

Next, the image data generating unit 38 generates image data ImgInit that serves as initial data (step S22). The image data generating unit 38 generates image data ImgInit representing the pattern corresponding to the mesh pattern M, based on the number of seed points SD and the position data SDd supplied from the storage unit 24, along with image information supplied from the image information estimating unit 36.

A variety of methods may be adopted as the algorithm for determining a mesh-shaped pattern from multiple seed points SD. Below, explanations shall be given in detail with reference to FIGS. 12A through 13B.

Figure 12A:
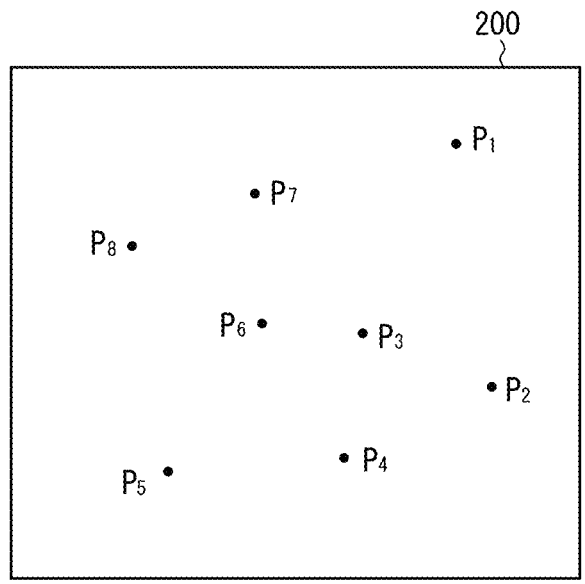
FIGS. 12A and 12B are explanatory diagrams of results using a Voronoi diagram, in which eight regions surrounding eight points are defined.

As shown in FIG. 12A, for example, it is assumed that eight points $P_1$ to $P_8$ are selected at random from within a rectangular two-dimensional image region 200.

Figure 12B:
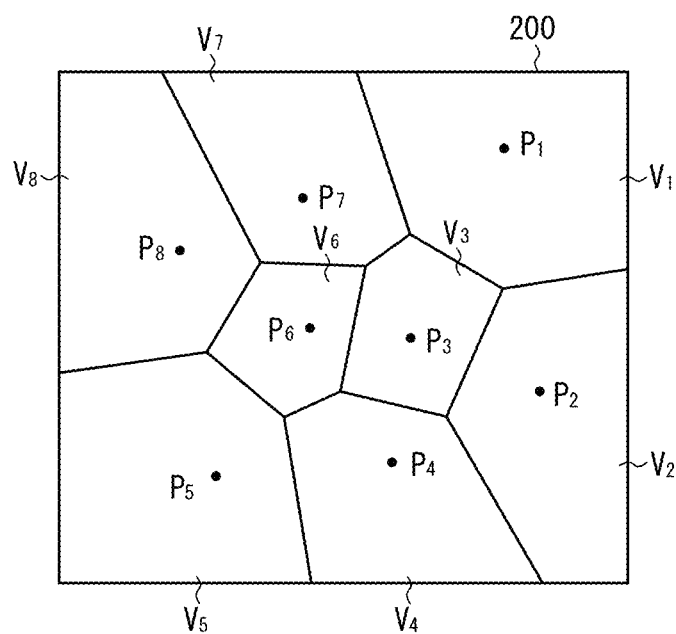

FIG. 12B is an explanatory diagram of results using a Voronoi diagram, in which eight regions $V_1$ through $V_8$ surrounding eight points $P_1$ to $P_8$ respectively are defined. Euclidean distance is used as a distance function. As can be understood from the drawing, with respect to the arbitrary points from within the region $V_i$ (where i=1 to 8), the point $P_i$ is shown to be the closest point of the points P.

Figure 13A:
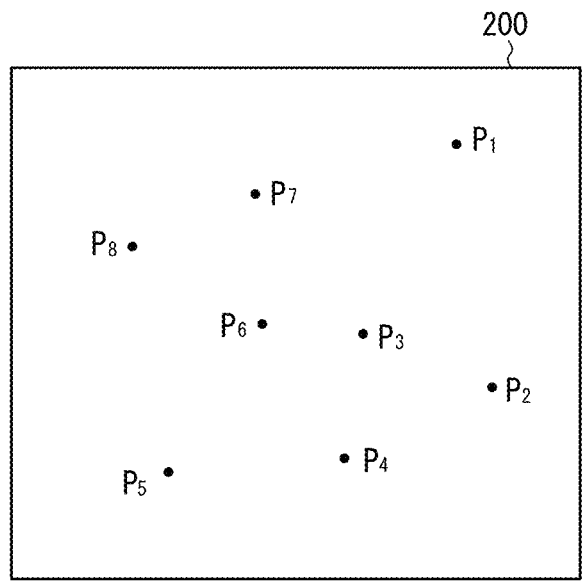
FIGS. 13A and 13B are explanatory diagrams of results using a Delaunay triangulation method, in which eight triangular regions are defined by respective vertices of eight points.
Figure 13B:
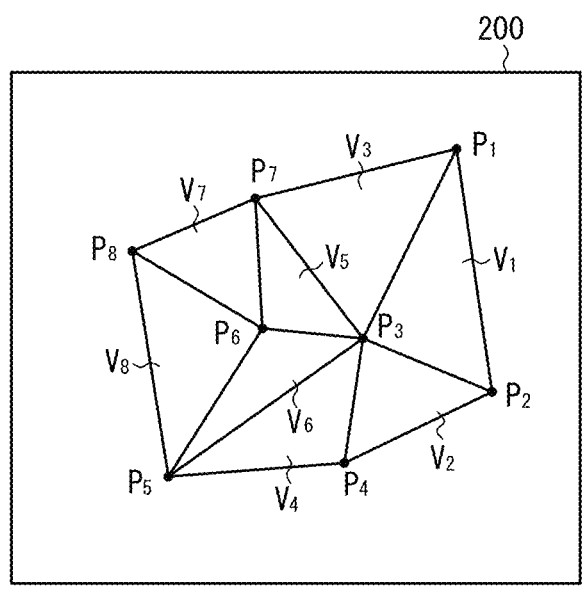

Further, in FIG. 13B, a result is shown in which eight triangular regions are defined by respective vertices of the points $P_1$ to $P_8$ of FIG. 13A (which is the same as FIG. 12A) using a Delaunay triangulation method.

Delaunay triangulation is a method of defining triangular shapes by connecting adjacent points from among the points $P_1$ to $P_8$. According to this method as well, regions $V_1$ to $V_8$ can be determined in the same number as the number of points $P_1$ to $P_8$.

Incidentally, prior to generating the image data Img (including the image data ImgInit and ImgTemp as well as the output image data ImgOut), definitions of pixel addresses and pixel values therefor are determined beforehand.

Figure 14A:
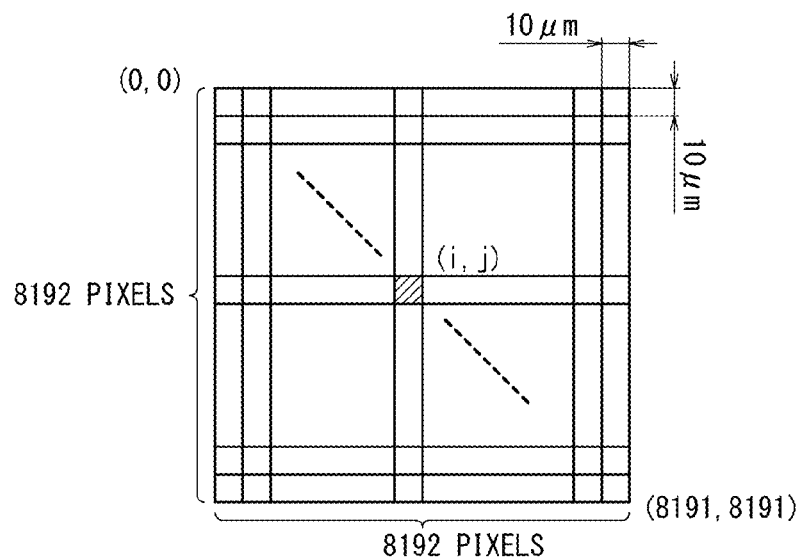
FIG. 14A is an explanatory diagram showing pixel address definitions in image data.

FIG. 14A is an explanatory diagram showing image pixel address definitions in the image data Img. For example, it is assumed that the pixel size is 10 µm, and the number of pixels in both vertical and horizontal directions of the image data is 8192 pixels respectively. For facilitating the FFT calculation process (to be described later), the number of pixels may be set as a power of 2 (e.g., 2 to the 13th power). At this time, the entire image region of the image data Img corresponds to a rectangular region of roughly 82 mm square.

Figure 14B:
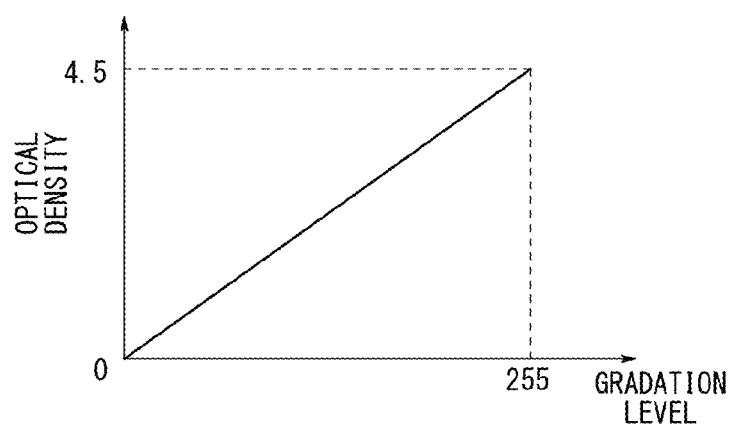
FIG. 14B is an explanatory diagram showing pixel value definitions in image data.

FIG. 14B is an explanatory diagram representing pixel value definitions in the image data Img. For example, it is assumed that the number of gradation levels for each individual pixel is 8 bits (256 gradations). An optical density of zero is set to correspond to a pixel value of zero (lowest value), whereas an optical density of 4.5 is set to correspond to a pixel value of 255 (highest value). For pixel values 1 to 254 therebetween, values are determined according to a linear relationship with respect to the optical density. It goes without saying that the optical density is not limited solely to transmissive density, but may be also reflective density, and can be selected appropriately depending on the manner in which the conductive film 14 is to be used. Further, apart from optical density, tristimulus values XYZ, RGB color values, or L*a*b* color values, etc., can also be used to define respective pixel values, similar to the above description.

Figure 15A:
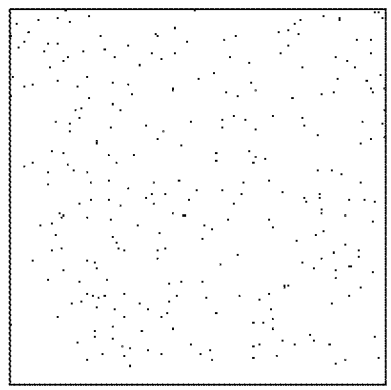
FIG. 15A is a schematic diagram of initial positions of seed points.
Figure 15B:
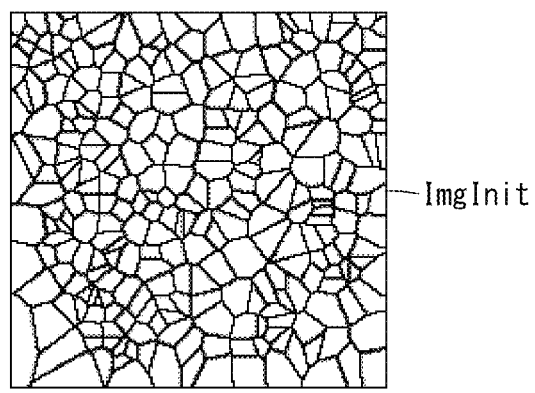
FIG. 15B is a Voronoi diagram formed on the basis of the seed points of FIG. 15A.

In this manner, the image data generating unit 38 creates the image data ImgInit corresponding to the mesh pattern M, based on the data definition of the image data Img and the image information estimated by the image information estimating unit 36 (refer to the description of step S1) (step S22). Using a Voronoi diagram as a reference for the initial positions of the seed points SD (see FIG. 15A), the image data generating unit 38 determines initial conditions for the mesh pattern M shown in FIG. 15B. Concerning the end portions of the image, processing is performed so as to repeatedly arrange the same in vertical and horizontal directions. For example, concerning seed points SD in the vicinity of the left end (or right end) of the image, the processing is performed such that regions $V_i$ are obtained between such left-end (or right-end) seed points SD and other seed points SD in the vicinity of the right end (or left end) of the image. Similarly, concerning seed points SD in the vicinity of the upper end (or lower end) of the image, the processing is performed such that regions $V_i$ are obtained between such upper-end (or lower-end) seed points SD and other seed points SD in the vicinity of the lower end (or upper end) of the image.

Below, the image data Img is handled as respective 4-channel image data made up of optical density OD, color value L*, color value a*, and color value b*.

Next, the mesh pattern evaluating unit 40 calculates the evaluation value EVPInit as an initial value (step S23). In the SA method, the evaluation value EVP assumes the role of a cost function.

More specifically, the FFT operating unit 100 shown in FIG. 4 effects FFT with respect to the image data ImgInit. In addition, the evaluation value calculating unit 102 calculates the evaluation value EVP based on the spectrum Spc supplied from the FFT operating unit 100.

From within the image data Img, evaluation values EVP (L*), EVP(a*), EVP(b*) are calculated respectively for each of the respective channels for the color value L*, the color value a*, and the color value b* (refer to formula (1) above). In addition, the evaluation value EVP is obtained by a product-sum operation using a predetermined weighting coefficient.

In place of the color values L*, a*, b*, optical density OD may also be used. In relation to the evaluation value EVP, depending on the type of observational mode, i.e., corresponding to whether the auxiliary light source is predominantly transmissive light, predominantly reflective light, or a mixture of transmissive and reflective light, an appropriate calculation method can be selected that complies with human visual sensitivity.

Further, it goes without saying that the formula for computing the evaluation value EVP may be changed corresponding to the target level (acceptable range or tolerance) or the evaluation function for determining the mesh pattern M.

In this manner, the mesh pattern evaluating unit 40 calculates the evaluation value EVPInit (step S23).

Next, the storage unit 24 temporarily stores the image data ImgInit created in step S22, and the evaluation value EVPInit calculated in step S23 (step S24). Along therewith, an initial value nΔT (where n is a natural number and ΔT is a positive real number) is assigned to the simulated temperature T.

Next, the counter 108 initializes the variable K (step S25). That is, the counter 108 assigns 0 to the variable K.

Then, in a state in which a portion of the seed points SD (second seed points SDS) are replaced by candidate points SP, and after image data ImgTemp is created as temporary data and evaluation data EVPTemp is calculated as temporary data, a determination is made as to whether to "update" or "not update" the seed points SD (step S26). Further details concerning step S26 will be described with reference to the flowchart of FIG. 16 and the functional block diagrams of FIG. 1 and FIG. 4.

First, the updated candidate position determining unit 30 extracts and determines candidate points SP from the predetermined two-dimensional image region 200 (step S261). The updated candidate position determining unit 30, for example, using a random value supplied from the random number generator 26, determines non-overlapping positions in relation to any of the positions of the seed points SD. The candidate points SP may be a single point or a plurality of points. In the example shown in FIG. 17A, two candidate points SP (point $Q_1$ and point $Q_2$) are determined with respect to the eight current seed points SD (points $P_1$ to $P_8$).

Figure 17A:
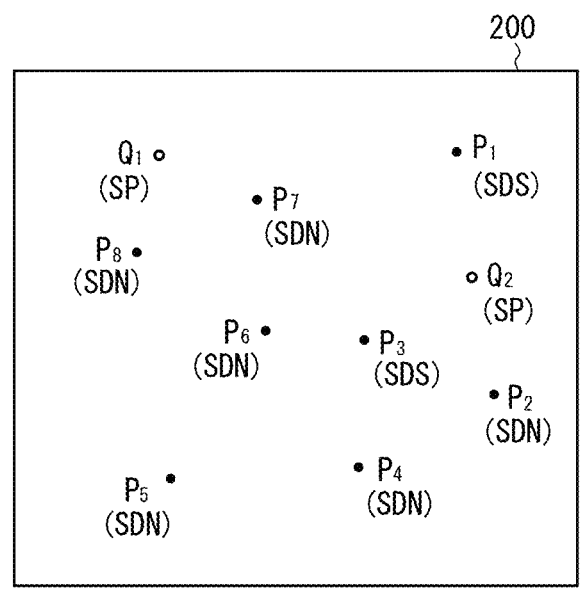
FIG. 17A is an explanatory drawing showing a positional relationship between first seed points, second seed points, and candidate points within an image region.
Figure 17B:
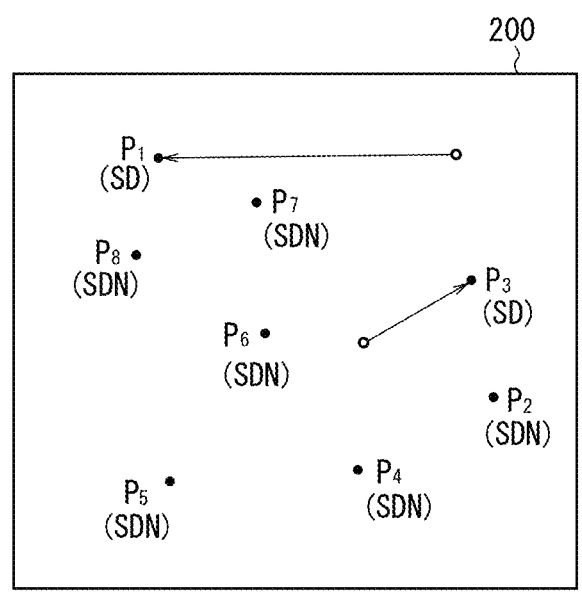
FIG. 17B is an explanatory drawing of a result in which the second seed points and the candidate points are exchanged to update the seed point positions.

Next, a portion of the seed points SD and the candidate points SP are exchanged at random (step S262). The updated candidate position determining unit 30 establishes a correspondence randomly between each of the candidate points SP and each of the exchanged (or updated) seed points SD. In FIG. 17A, a correspondence is established between point $P_1$ and point $Q_1$, and also between point $P_3$ and point $Q_2$. As shown in FIG. 17B, the point $P_1$ and the point $Q_1$ are exchanged, and the point $P_3$ and the point $Q_2$ are exchanged. In this case, points $P_2$ and points $P_4$ to $P_8$, which are not subject to exchange (or updating), are referred to as first seed points SDN, whereas point $P_1$ and point $P_3$, which are subject to exchange (or updating), are referred to as second seed points SDS.

Then, using the exchanged and updated seed points SD (see FIG. 17B), the image data generating unit 38 generates the image data ImgTemp (step S263). At this time, the method used is the same as in the case of step S22 (see FIG. 10) and thus explanations therefor are omitted.

Next, the mesh pattern evaluating unit 40 calculates an evaluation value EVPTemp based on the image data ImgTemp (step S264). At this time, the method used is the same as in the case of step S24 (see FIG. 10) and thus explanations therefor are omitted.

Next, the update probability calculation unit 112 calculates an update probability Prob for updating the positions of the seed points SD (step S265). The phrase "updating the positions" implies determining, as new seed points SD, seed points SD that are tentatively exchanged and obtained in step S262 (i.e., the first seed points SDN and the candidate points SP).

More specifically, in accordance with the Metropolis Criterion, a probability of updating the seed points SD and a probability of not updating the seed points SD are calculated. The update probability Prob is given by the following formula (2).

$$Prob = \begin{cases} 1 & \text{(if } EVPTemp < EVP) \\ \exp\left(-\dfrac{EVPTemp - EVP}{T}\right) & \text{(if } EVPTemp \geq EVP) \end{cases} \quad (2)$$

The variable T represents a simulated temperature, wherein, in accordance with the simulated temperature T approaching an absolute temperature (T=0), the updating rule for the seed points SD changes from stochastic to deterministic.

Next, in accordance with the update probability Prob calculated by the update probability calculation unit 112, the position update determining unit 114 determines whether or not to update the positions of the seed points SD (step S266). For example, such a determination may be made stochastically using a random number value supplied from the random number generator 26.

In the case that the seed points SD are to be updated, an "update" instruction is given to the storage unit 24, whereas in the case that the seed points SD are not to be updated, a "do not update" instruction is given to the storage unit 24 (steps S267, S268).

In the foregoing manner, step S26 is brought to an end.

Returning to FIG. 10, in accordance with either of the instructions "update" or "do not update", it is determined whether or not the seed points SD should be updated (step S27). In the case that the seed points SD are not updated, step S29 is not performed and the routine proceeds directly to step S30.

On the other hand, in the case that the seed points SD are to be updated, in step S28, the storage unit 24 overwrites and updates the presently stored image data Img with the image data ImgTemp determined in step S263 (see FIG. 16). Further, also in step S28, the storage unit 24 overwrites and updates the presently stored evaluation value EVP with the evaluation value EVPTemp determined in step S264. Furthermore, also in step S28, the storage unit 24 overwrites and updates the presently stored position data SDSd of the second seed points SDS with the position data SPd of the candidate points SP determined in step S261. Thereafter, the routine proceeds to step S29.

Next, the counter 108 increments the value of K at the present time by 1 (step S29).

Then, the counter 108 compares a magnitude relationship between the value of K at the present time and the predetermined value of Kmax (step S30). If the value of K is smaller than Kmax, then the process returns to step S26, and steps S26 to S29 thereafter are repeated. In this case, in order to sufficiently ensure convergence at an optimized calculation, the value of Kmax can be set, for example, at Kmax=10000.

In cases apart therefrom, the simulated temperature management unit 110 decrements the simulated temperature T by ΔT (step S31) and then proceeds to step S32. The change in the simulated temperature T is not limited to being decremented by ΔT, but the simulated temperature T may also be multiplied by a fixed constant δ (0<δ<1). In this case, the update probability Prob (lower) indicated in formula (2) is decremented by a constant value.

Next, the simulated temperature management unit 110 determines whether or not, at the present time, the simulated temperature T is equivalent to zero (step S32). If T is not equal to zero, then the process returns to step S25, and steps S25 to S31 are repeated.

On the other hand, if T is equivalent to zero, then the simulated temperature management unit 110 issues a notification to the output image data determining unit 116 to the effect that evaluation of the mesh pattern by the SA method has been completed. In addition, the storage unit 24 overwrites the content of the updated image data Img, which was updated for the last time in step S28, onto the output image data ImgOut, thereby updating the same (step S33).

In this manner, step S2 is brought to an end. Thereafter, the output image data ImgOut is supplied to the exposure data conversion unit 32, and then converted into a control signal for the exposure unit 18.

So that the operator can visually confirm the data, the obtained output image data ImgOut may be displayed on the display device 22, and the mesh pattern M may be made visual in a simulated manner. Below, an example shall be described of actual visual results of the output image data ImgOut.

Figure 18:
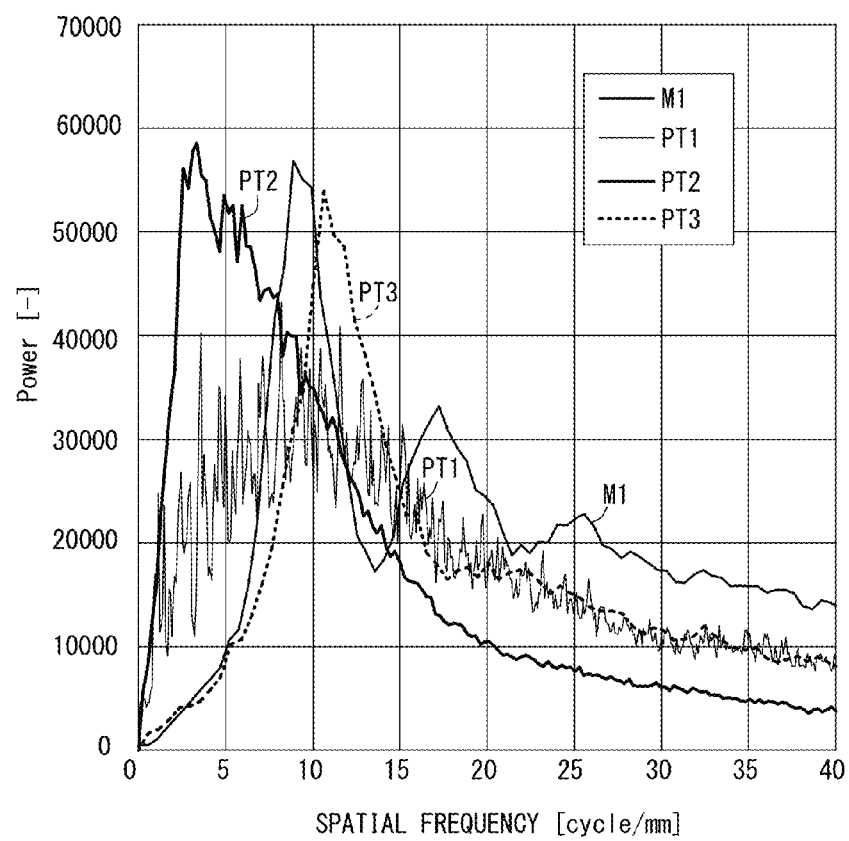
FIG. 18 is a cross sectional view taken along the X-axis of two-dimensional power spectra obtained by effecting FFT respectively on image data of various patterns according to comparative examples and of a mesh pattern according to a present embodiment.

FIG. 18 is a cross sectional view taken along the X-axis of spectra Spc obtained by effecting FFT respectively on image data representing various types of patterns PT1 to PT3 (see FIGS. 33A to 33C) according to conventional examples, and the first mesh pattern M1 according to a present embodiment.

Figure 33A:
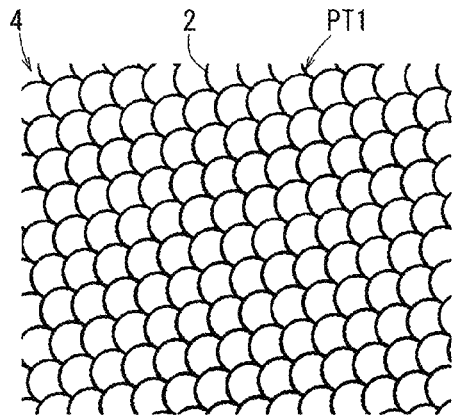
FIGS. 33A through 33C are enlarged plan views of patterns in accordance with respective comparative examples.
Figure 33B:
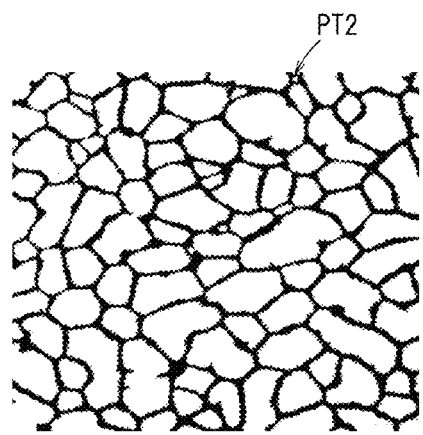
Figure 33C:
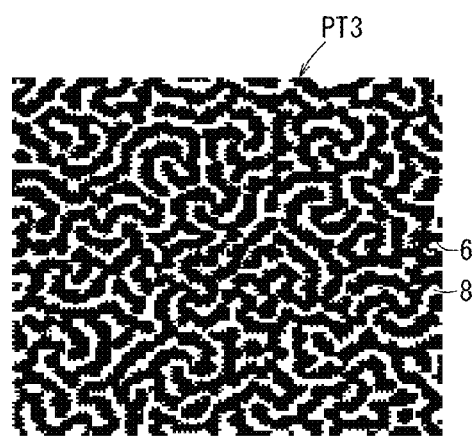

The spectrum Spc of the pattern PT1 shown in FIG. 33A has a broad width peak (2 to 30 cycle/mm) with an apex at approximately 10 cycle/mm. Further, the spectrum Spc of the pattern PT2 shown in FIG. 33B has a broad width peak (3 to 20 cycle/mm) centered at approximately 3 cycle/mm. Furthermore, the spectrum Spc of the pattern PT3 shown in FIG. 33C has a comparatively narrow width peak (8 to 18 cycle/mm) centered at approximately 10 cycle/mm. In contrast thereto, the spectrum Spc of the first mesh pattern M1 has a narrow width peak centered at 8.8 cycle/mm.

Figure 19:
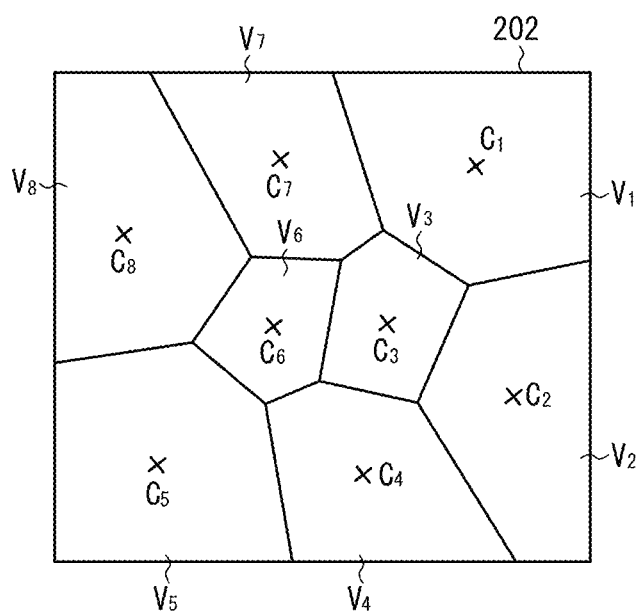
FIG. 19 is an explanatory drawing showing centroid positions of each of the regions shown in FIG. 12B.

An explanation shall be given next concerning a relationship between characteristics of the spectrum Spc shown in FIG. 8C and centroid positions of the respective meshes. As shown in FIG. 19, with respect to a two-dimensional image region 202 similar to that shown in FIG. 12B, using the aforementioned Voronoi diagram, respective polygonal shaped regions $V_1$ to $V_8$ are defined. Points $C_1$ to $C_8$ belonging respectively to the regions $V_1$ to $V_8$ represent centroid positions of such regions respectively.

Figure 20:
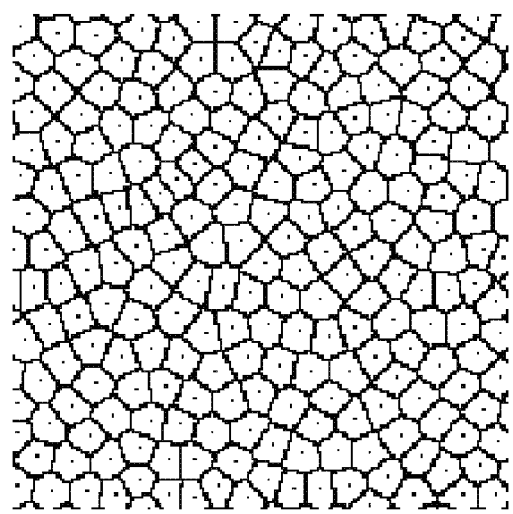
FIG. 20 is an outline explanatory drawing showing a relationship between plural meshes and centroid positions of the meshes, in relation to a first mesh pattern according to the present embodiment.

FIG. 20 is an outline explanatory drawing showing a relationship between plural meshes and centroid positions of the meshes, in relation to the first mesh pattern M1 according to the present embodiment.

Figure 21A:
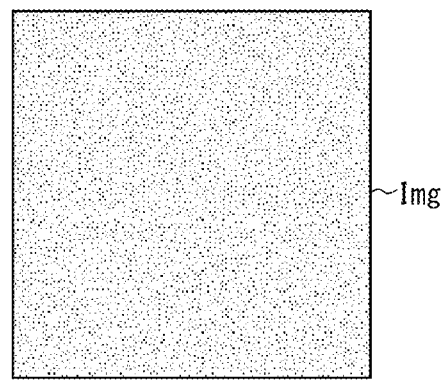
FIG. 21A is an outline explanatory drawing in which image data is made visible showing a distribution of centroid positions of respective meshes having the mesh pattern of FIG. 20.

FIG. 21A is an outline explanatory drawing in which image data (hereinafter referred to as "centroid image data Imgc") are made visible, showing a distribution of centroid positions (hereinafter referred to as a "centroid distribution C") of respective meshes of the first mesh pattern M1 of FIG. 20. As understood from the drawing, the centroid distribution C is such that the centroid positions are scattered suitably so as not to overlap mutually with each other.

Figure 21B:
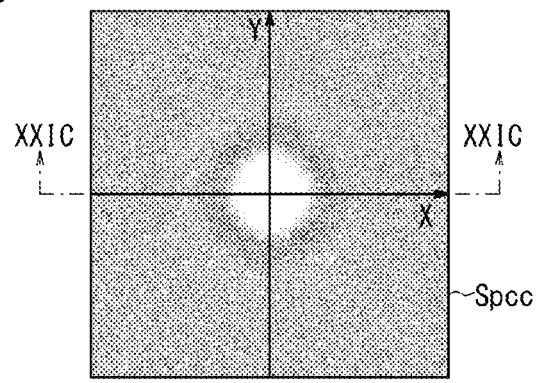
FIG. 21B is a distribution diagram of a two-dimensional power spectrum obtained by effecting FFT with respect to the image data of FIG. 21A.

FIG. 21B is a distribution diagram of a two-dimensional spectrum (hereinafter referred to as a "centroid spectrum Spcc") obtained by effecting FFT with respect to the centroid image data Imgc of FIG. 21A. The horizontal axis of the distribution diagram shows the spatial frequency with respect to the X-axis direction, whereas the vertical axis thereof shows the spatial frequency with respect to the Y-axis direction. Further, within each spatial frequency band, as the display density becomes thinner, the intensity level (spectral value) becomes smaller, whereas as the display density becomes denser, the intensity level becomes greater. The distribution of the centroid spectrum Spcc is isotropic and exhibits one annular peak.

Figure 21C:
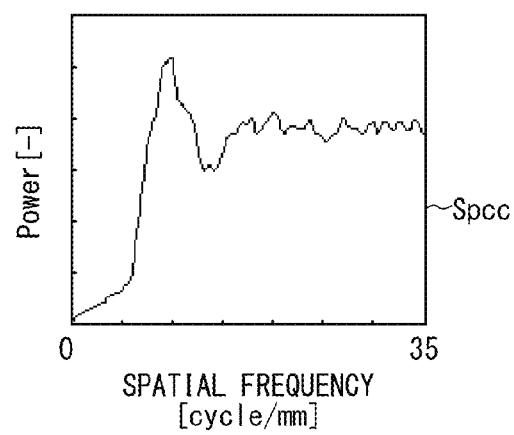
FIG. 21C is a cross sectional view taken along line XXIC-XXIC of the distribution of the two-dimensional power spectrum shown in FIG. 21B.

FIG. 21C is a cross sectional view taken along line XXIC-XXIC of the distribution of the centroid spectrum Spcc shown in FIG. 21B. Because the centroid spectrum Spcc is isotropic, FIG. 21C corresponds to a radial distribution with respect to all angular directions. As understood from the present drawing, the intensity level becomes small in a low spatial frequency band, and has a broad peak in an intermediate spatial frequency band. Furthermore, a so-called high-pass characteristic is exhibited in which, in contrast to low spatial frequency bands, the intensity level is high in high spatial frequency bands. More specifically, according to common technical terminology in the field of image engineering, the centroid image data Imgc shown in FIG. 21A is representative of a pattern having a "blue noise" characteristic.

Figure 22:
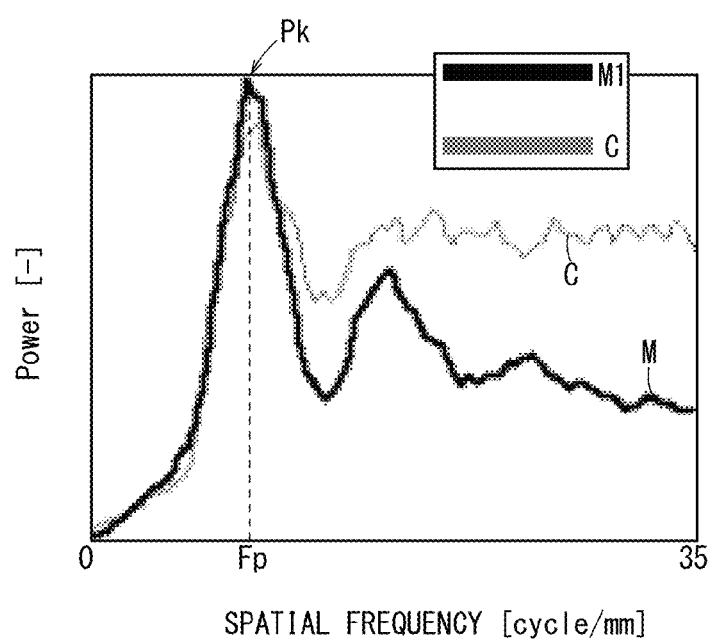
FIG. 22 is a comparative drawing illustrating the spectra shown in FIG. 8C and the centroid spectrum shown in FIG. 21C.

FIG. 22 is a comparative drawing illustrating the spectra Spc shown in FIG. 8C and the centroid spectrum Spcc shown in FIG. 21. More specifically, the spectrum Spc of the first mesh pattern M1 is compared with the centroid spectrum Spcc of the centroid distribution. For the sake of convenience, intensities of the spectra are normalized so that the maximum peak values PK thereof are in agreement.

According to the present drawing, peaks $P_K$ of the spatial frequencies $F_P$ are in agreement, corresponding to a value of 8.8 cycle/mm. In high spatial frequency bands in excess of the spatial frequency $F_P$, the intensity of the spectrum Spc gradually decreases, whereas in contrast thereto, the intensity of the centroid spectrum Spcc is maintained at an even higher value. The reason therefor is presumed to be that, in contrast to the constituent elements of the mesh pattern M being line segments having a predetermined width and which intersect each other, the constituent elements of the centroid distribution are points.

Figure 23:
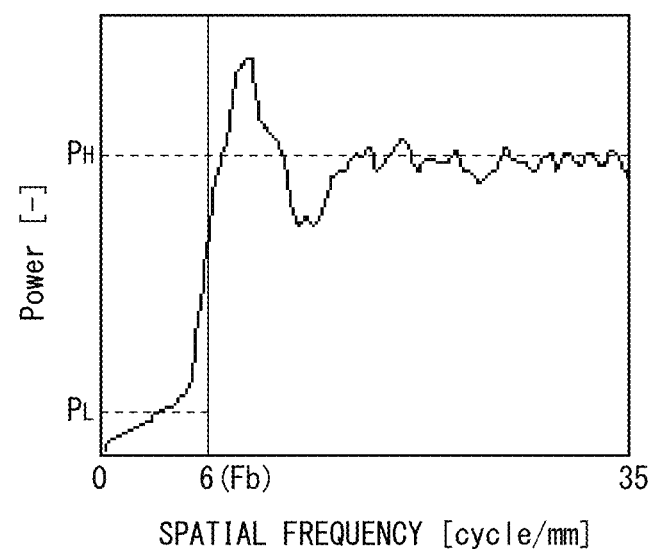
FIG. 23 is an outline explanatory drawing representative of characteristics of the power spectrum of FIG. 21C.

FIG. 23 is an outline explanatory drawing representative of characteristics of the centroid spectrum Spcc of FIG. 21C. The value of the centroid spectrum Spcc increases gradually in a range of 0 to 5 cycle/mm, increases rapidly in the vicinity of 6 cycle/mm, and has a broad peak at roughly 10 cycle/mm. In addition, the value of the centroid spectrum Spcc decreases gradually in a range of 10 to 15 cycle/mm, and is maintained at a high value in high spatial frequency bands in excess of 15 cycle/mm.

A standard spatial frequency (predetermined spatial frequency) Fb is set to 6 cycle/mm. Within a range on the side of a spatial frequency band lower than Fb, i.e., within a range from 0 to Fb [cycle/mm], the average value of the centroid spectrum Spcc is set to $P_L$. On the other hand, within a range on the side of a spatial frequency band higher than Fb, i.e., within a range from Fb [cycle/mm] to the Nyquist frequency, the average value of the centroid spectrum Spcc is set to $P_H$. In this manner, the value of $P_H$ is greater than the value of $P_L$. Since the centroid frequency Spcc has such a characteristic, the sensation of noise that is felt visually by an observer is reduced. The basis therefor is as follows.

For example, the value of Fb is set so that a spatial frequency results in which the human visual response characteristic corresponds to 5% of the maximum response. Assuming an intensity level is present, the level is such that visibility is difficult. Further, as shown in FIG. 9, an acquired visual response characteristic is used based on a Dooley-Shaw function at a visibility distance of 300 mm. The present function is closely compatible with human visual response characteristics.

More specifically, as the value Fb in the Dooley-Shaw function at a visibility distance of 300 mm, there can be used a spatial frequency of 6 cycle/mm, which corresponds to 5% of the maximum response. It is further noted that 6 cycle/mm corresponds to an interval of 167 μm.

In the present specification, the power spectrum of a centroid position distribution of the mesh pattern M, which is possessed by the conductive film 14, corresponds with a spectrum obtained by the following process. More specifically, image data ImgOut representing the pattern of the mesh pattern M are acquired, respective meshes (closed spaces) are identified, centroid positions (e.g., one pixel dot) thereof are calculated respectively and centroid image data Imgc are determined, and a two-dimensional power spectrum (centroid spectrum Spcc) thereof is determined, whereby a power spectrum of the centroid position distribution of the mesh pattern M is obtained. Concerning the method for acquiring the image data ImgOut, grayscale image data of the conductive film 14 may be acquired using an input apparatus such as a scanner or the like, or image data ImgOut (see FIG. 1) obtained using the actual output form of the mesh pattern M may be used.

Figure 7:
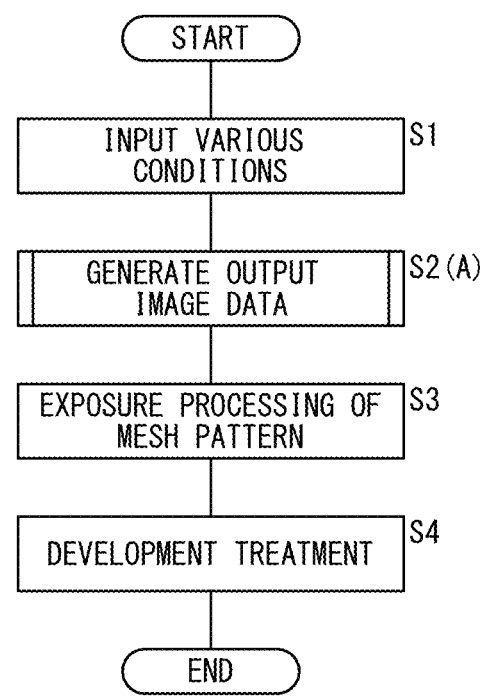
FIG. 7 is a flowchart providing a description of operations of the manufacturing apparatus of FIG. 1.
Figure 24:
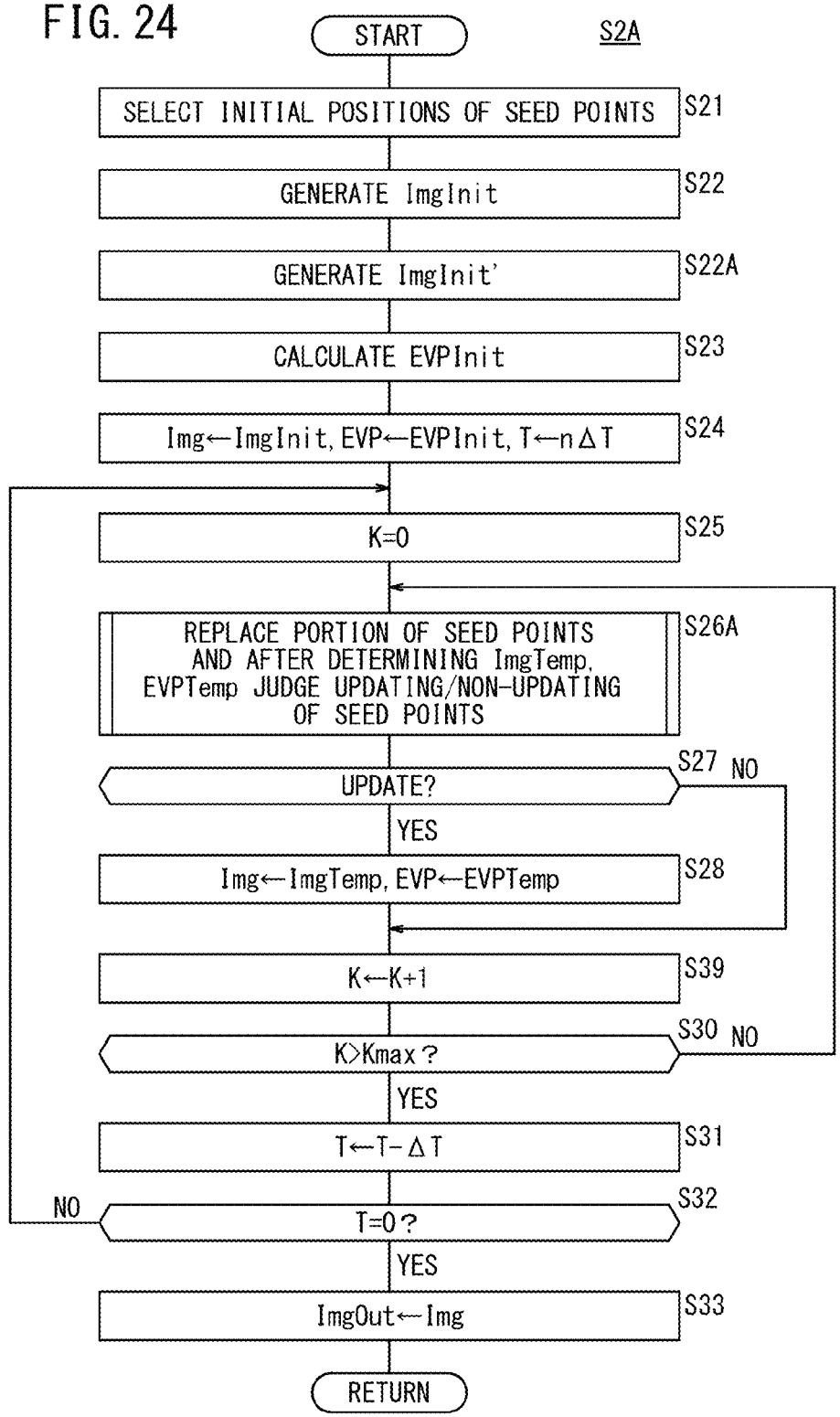
FIG. 24 is a second flowchart explaining the method of creating output image data.
Figure 25:
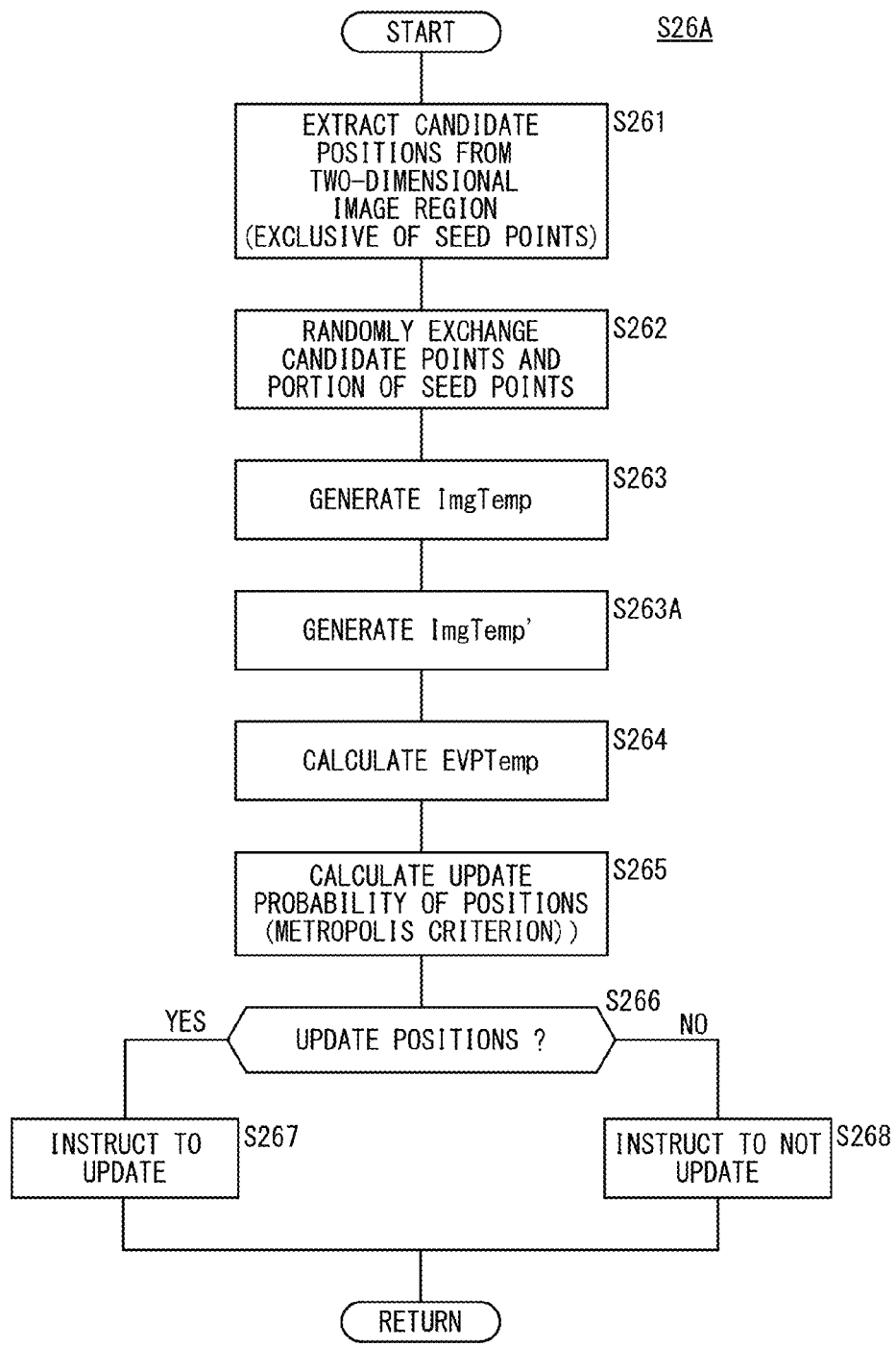
FIG. 25 is a detailed flowchart of step S26A shown in FIG. 24.

Next, with reference to FIGS. 7 and 24 and the flowchart of FIG. 25, an explanation shall be given concerning a method of generating a second mesh pattern M2, which is suitable under a condition in which a black matrix 59 (see FIG. 2B) is superimposed.

In the flowchart of FIG. 7, operations of the manufacturing apparatus 10 are basically the same as the case of generating the first mesh pattern M1. Upon inputting the various conditions (step S1), not only visual information in relation to visibility of the mesh pattern M, but visual information in relation to the black matrix 59 also are input.

The operator inputs appropriate numerical values via the setting screen 160 (see FIG. 6) displayed on the display device 22. As a result, visual information in relation to visibility of the black matrix 59 can be input. The visible information of the black matrix 59 is defined by various types of information that contribute to the shape and optical density of the black matrix 59, and includes visual information of the pattern material. As visual information of the pattern material, for example, there are included at least one of a type, a color, an optical transmittance, or an optical reflectance of the pattern material, or an arrangement position, a unit shape, or a unit size of the structural pattern may be included in the visual information of the pattern material.

In relation to the black matrix 59 that is to be superimposed, the operator inputs various conditions of the black matrix 59 using the text box 164 shown in FIG. 6.

The inputs made via the radio buttons 162a, 162b correspond to whether or not output image data ImgOut is created representing a pattern in which the black matrix 59 is superimposed on the mesh pattern M. In the present case, the black matrix is superimposed, and therefore, the radio button 162a ("PRESENCE") is selected.

The value input to the text box 164 randomly determines the arrangement position of the black matrix 59, and corresponds to the number of trials carried out to generate and evaluate the image data Img. For example, in the event the value is set to 5 times, five instances of superimposed image data are created in which positional relationships are determined between the mesh pattern M and the black matrix 59, and using respective average values of the evaluation value EVP, evaluation of the pattern of the mesh is carried out.

The values of the text boxes 166, 168, 170, 172 correspond to the optical density of the black matrix 59 (units: D), the vertical size of the unit pixel 60 (units: μm), the horizontal size of the unit pixel 60 (units: μm), the width of the light-shielding material 61h (units: μm), and the width of the light-shielding material 61v (units: μm).

Furthermore, based on the optical density of the black matrix 59 (text box 166), the vertical size of the unit pixel 60 (text box 168), the horizontal size of the unit pixel 60 (text box 170), the width of the light-shielding material 61h (text box 172), and the width of the light-shielding material 61v (text box 174), the pattern of the mesh pattern M (i.e., the shape and optical density) in the case that the black matrix 59 is superimposed can be estimated.

FIG. 24 is a second flowchart explaining the method of creating output image data ImgOut. Compared with FIG. 10, the present figure differs in that a step (step S22A) is provided for generating superimposed image data ImgInit'. Further, a feature (step S26A) in which it is determined from later-described superimposed image data ImgTemp' whether to update or not update the seed points SD differs from step S26 (see FIG. 10). The other steps S21 through S25, and S27 through S33 are the same as already described above, and thus explanation of the operations of such steps is omitted.

In step S22A, the image data generating unit 38 generates superimposed image data ImgInit' based on the image data ImgInit generated in step S22 and image information of the black matrix 59 estimated by the image information estimating unit 36 (refer to the explanation of step S1). The superimposed image data ImgInit' is image data representative of a pattern in which a black matrix 59 as a structural pattern is superimposed on the second mesh pattern M2.

In the case that the data definitions for pixel values of the image data ImgInit are indicative of transmission density, the transmission density (the value input to the text box 166 in FIG. 6) of each of the pixels is added corresponding to the arrangement position of the black matrix 59, and the superimposed image data ImgInit' can be generated. Further, in the case that the data definitions for pixel values of the image data ImgInit are indicative of reflection density, the reflection density (the value input to the same text box 166) of each of the pixels is substituted therefor corresponding to the arrangement position of the black matrix 59, and the superimposed image data ImgInit' can be generated.

In step S26A, in a condition in which a portion of the seed points SD (second seed points SDS) are replaced by candidate points SP, superimposed image data ImgTemp' is generated, and after the evaluation value EVPTemp is calculated, a determination is made as to whether to "update" or "not update" the seed points SD.

The flowchart of FIG. 25, in comparison with FIG. 16, differs in that a step (step S263A) is provided for generating superimposed image data ImgTemp'. The other steps S261 through S268 are the same as already described above, and thus explanation of the operations of such steps is omitted.

In step S263A, the image data generating unit 38 generates superimposed image data ImgTemp' based on the image data ImgTemp generated in step S263 and image information of the black matrix 59 estimated by the image information estimating unit 36 (refer to the explanation of step S1). At this time, the method used is the same as in the case of step S22A (see FIG. 24) and thus explanations therefor are omitted.

In this manner, in addition to generating the superimposed image data ImgTemp' (or the superimposed image data ImgInit'), by calculating the evaluation data EVP (or the evaluation data EVPInit), the mesh shape can be evaluated taking into consideration the pattern of the black matrix 59.

In the foregoing manner, step S2A is brought to an end. Thereafter, the output image data ImgOut is supplied to the exposure data conversion unit 32, in order to produce image data that is converted into a control signal for the exposure unit 18.

Figure 26A:
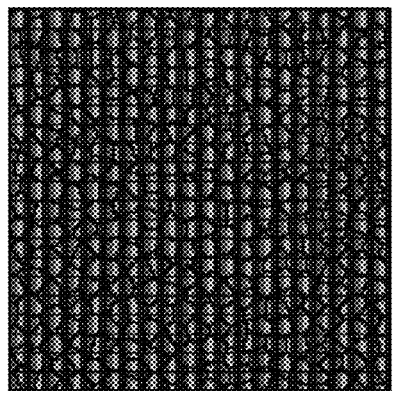
FIG. 26A is a visual outline explanatory drawing in which a black matrix is superimposed on output image data representing the pattern of a conductive film.

FIG. 26A is a visual outline explanatory drawing in which a black matrix 59 is superimposed on output image data ImgOut representative of the pattern of the conductive film 14. The second mesh pattern M2, a red filter 58r, a green filter 58g, a blue filter 58b, and the black matrix 59 are shown respectively so as to enable them to be distinguished from each other.

Figure 26B:
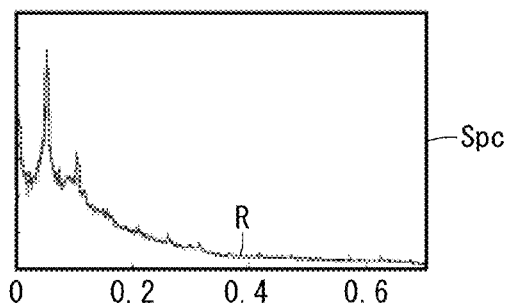
FIGS. 26B through 26D are graphs representing results in which R-component, G-component, and B-component color values within the image data of FIG. 26A are extracted respectively and power spectra are calculated therefrom.
Figure 26C:
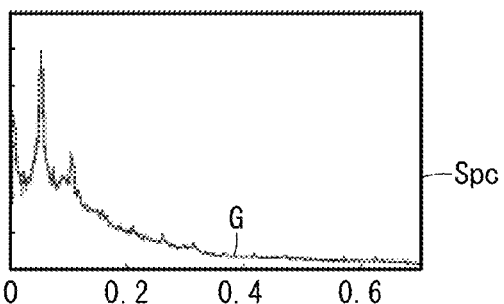
Figure 26D:
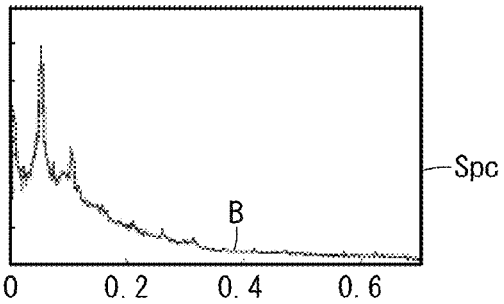

FIGS. 26B through 26D are graphs representing results in which R-component, G-component, and B-component color values within the image data ImgOut of FIG. 26A are extracted respectively and spectra Spc are calculated therefrom. As shown in FIGS. 26B to 26D, spectra Spc are obtained which are substantially the same for each of the RGB components. In any of such spectra, noise peaks are generated centered about spatial frequencies corresponding to the arrangement interval of the light shielding materials 61h, 61v of the black matrix 59.

Figure 27A:
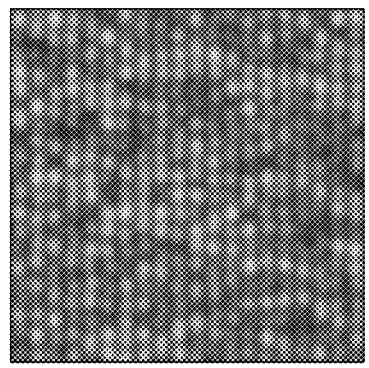
FIG. 27A is a visual outline explanatory drawing in which human visual response characteristics are applied with respect to the image data of FIG. 26A.

In contrast thereto, FIG. 27A is a visual outline explanatory drawing in which human visual response characteristics are applied with respect to the output image data ImgOut of FIG. 26A. By applying human visual response characteristics, or stated otherwise, by applying a low-pass filter (see FIG. 9), fine structural contours of the second mesh pattern M2 and the black matrix 59 are rendered almost visually imperceptible.

Figure 27B:
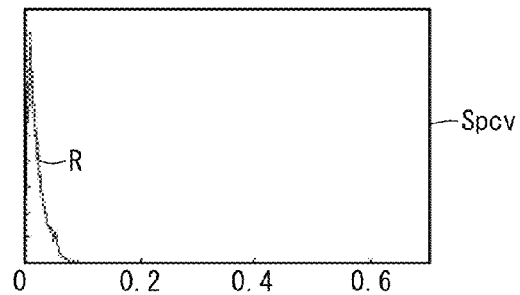
FIGS. 27B through 27D are graphs representing results in which R-component, G-component, and B-component color values within the image data of FIG. 27A are extracted respectively and power spectra are calculated therefrom.
Figure 27C:
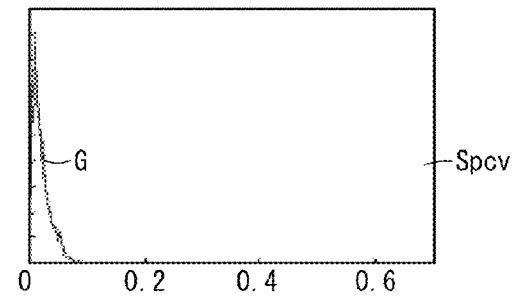
Figure 27D:
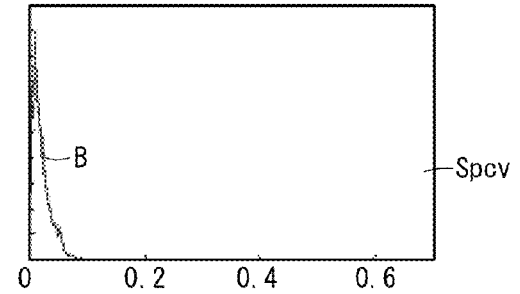

FIGS. 27B through 27D are graphs representing results in which R-component, G-component, and B-component color values within the image data of FIG. 27A are extracted respectively and power spectra Spcv are calculated therefrom. Compared with FIG. 26A, the aforementioned peak noise characteristics are shifted toward the low spatial frequency side, together with reducing the area formed by the spectra Spcv.

Using such a method, concerning noise characteristics of the second mesh pattern M2 on which the black matrix 59 is superimposed, an evaluation can be performed which conforms more closely to human visual response characteristics.

Figure 28A:
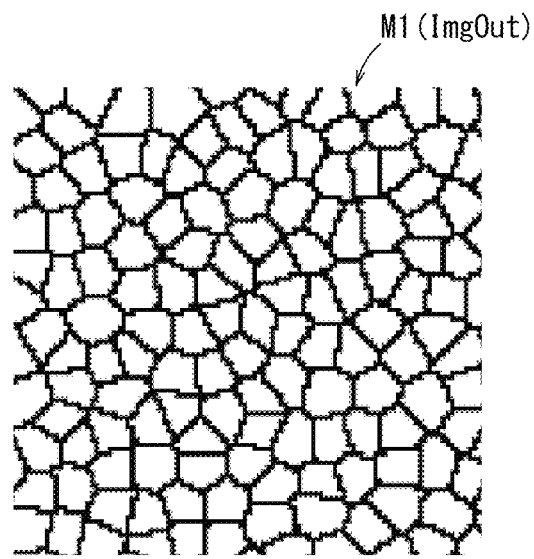
FIG. 28A is an outline explanatory view of visual image data representative of a first mesh pattern optimized under conditions of not being superimposed with a black matrix.
Figure 28B:
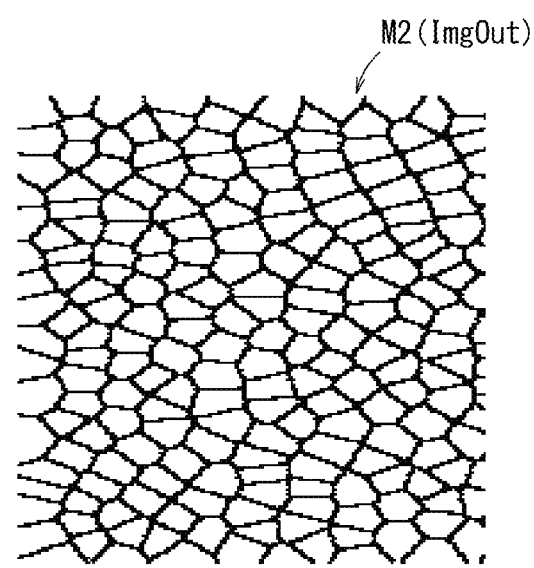
FIG. 28B is an outline explanatory view of visual image data representative of a second mesh pattern optimized under conditions of being superimposed with a black matrix.

FIG. 28A is an outline explanatory view in which a second mesh pattern M2 is made visual, which is representative of the pattern of the conductive film 14, using output image data ImgOut optimized under conditions of not being superimposed with the black matrix 59. FIG. 28B is an outline explanatory view in which the second mesh pattern M2 is made visual, which is representative of the pattern of the conductive film 14, using output image data ImgOut optimized under conditions of being superimposed with the black matrix 59.

As can be understood from FIGS. 28A and 28B, compared to the pattern of the mesh pattern M1, the pattern (each of the openings 52) of the mesh pattern M2 has a laterally elongate shape as a whole. The basis therefore is estimated in the following manner.

For example, the shape of the unit pixels 60 of the black matrix 59 shown in FIG. 2B is assumed to be square. By arranging the red filters 58r, green filters 58g, and blue filters 58b in a horizontal direction, the unit pixels 60 are partitioned into regions that are ⅓ the size of the unit pixels 60, whereby noise granularity of high spatial frequency components increases. On the other hand, in the vertical direction, only spatial frequency components exist that correspond to the period at which the light shielding materials 61h are disposed, and so that spatial frequency components apart therefrom do not exist, the pattern of the mesh pattern M2 is determined such that visibility of the arrangement period is low. In other words, respective wires that extend in the horizontal direction are determined so that the intervals therebetween are as narrow as possible, and the wires are arranged regularly between the respective light shielding materials 61h.

In this manner, by superimposing the black matrix 59 (structural pattern) and creating the image data Img (including output image data ImgOut), the mesh shape can be optimized taking into consideration the pattern of the black matrix 59.

Returning to FIG. 7, the exposure unit 18 carries out an exposure process for the mesh pattern M (step S3), and thereafter, a development treatment is performed (step S4).

Several methods (first through fourth methods) for producing mesh patterns M from metallic thin wires 54 disposed on the transparent film substrate 56 will be described below with reference to FIGS. 29A to 32.

In the first method, a photosensitive silver salt layer is exposed, developed, and fixed on the transparent film substrate 56 to form metallic silver portions. The metallic silver portions are utilized for constituting the mesh pattern M.

Figure 29A:
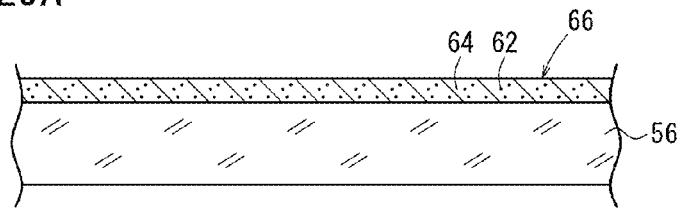
FIGS. 29A through 29E are process diagrams showing a first conductive film manufacturing method according to the present embodiment.

More specifically, as shown in FIG. 29A, the transparent film substrate 56 is coated with a photosensitive silver salt layer 66 containing a mixture of a gelatin 64 and a silver halide 62 (e.g., silver bromide particles, silver chlorobromide particles, or silver iodobromide particles). Although the silver halide 62 is exaggeratingly shown by points in FIGS. 29A to 29C to facilitate understanding, the points do not represent the size, concentration, etc.

Figure 29B:
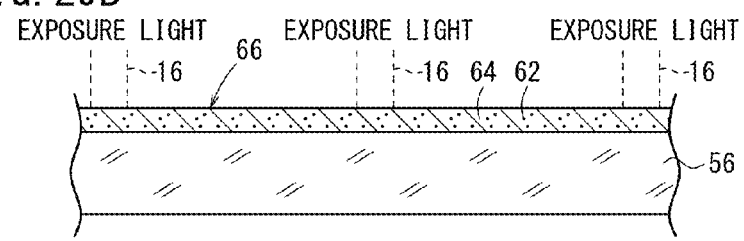

Thereafter, as shown in FIG. 29B, the photosensitive silver salt layer 66 is subjected to an exposure treatment required for forming the conductive portion 50. More specifically, the photosensitive silver salt layer 66 is irradiated with the light 16 via a mask pattern that corresponds to an exposure pattern obtained through the pattern generating process shown in FIG. 10 or FIG. 24. Alternatively, an exposure pattern generated by the pattern generating process exposes the photosensitive silver salt layer 66 in accordance with digital writing exposure applied with respect to the photosensitive silver salt layer 66. If optical energy is applied to the silver halide 62, the silver halide 62 is exposed to generate minute silver nuclei therein, referred to as a "latent image", which are not observable to the naked eye.

Figure 29C:
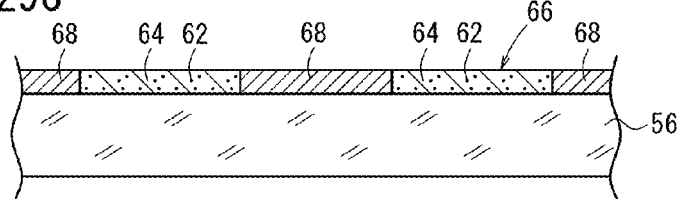

Then, as shown in FIG. 29C, the photosensitive silver salt layer 66 is subjected to a development treatment for converting the latent image into a visible image observable to the naked eye. More specifically, the photosensitive silver salt layer 66 having the latent image is developed using a developer (i.e., an alkaline or acidic solution, generally an alkaline solution). In the development treatment, using the latent image silver nuclei as catalyst cores, silver ions from the silver halide particles or the developer are reduced to metallic silver by a reducing agent in the developer (referred to as a developing agent). As a result, the latent image silver nuclei are grown to form a visible silver image (developed silver 68).

Figure 29D:
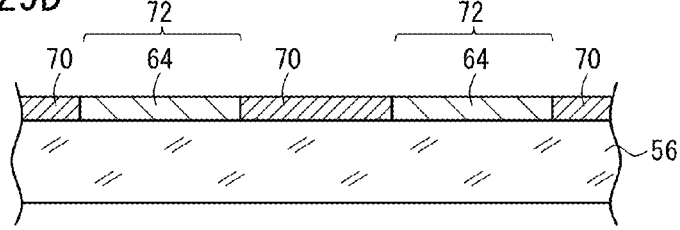

The silver halide 62 remains in the photosensitive silver salt layer 66 after the development treatment. As shown in FIG. 29D, the silver halide 62 is removed by a fixation treatment using a fixer (an acidic or alkaline solution, generally an acidic solution).

After the fixation treatment, metallic silver portions 70 are formed in exposed areas, and light-transmitting portions 72 containing only the gelatin 64 are formed in unexposed areas. Thus, a combination of the metallic silver portions 70 and the light-transmitting portions 72 is formed on the transparent film substrate 56, to thereby form the mesh pattern M.

In the case that silver bromide is used as the silver halide 62 and a thiosulfate salt is used in the fixation treatment, a reaction represented by the following formula proceeds in the treatment.

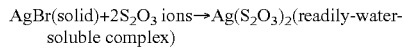

$$AgBr(solid) + 2S_2O_3 \text{ ions} \rightarrow Ag(S_2O_3)_2 (\text{readily-water-soluble complex})$$

More specifically, two thiosulfate $S_2O_3$ ions and one silver ion in the gelatin 64 (a silver ion from AgBr) are reacted to generate a silver thiosulfate complex. The silver thiosulfate complex has a high water solubility, and thereby is eluted from the gelatin 64. As a result, the developed silver 68 is fixed and remains as metallic silver portions 70. The mesh pattern M is constituted by the metallic silver portions 70.

Thus, in the development treatment, the latent image is reacted with the reducing agent to deposit the developed silver 68, and in the fixation treatment, the residual silver halide 62, which is not converted into developed silver 68, is eluted into water. The treatments are described in detail in T. H. James, "The Theory of the Photographic Process, 4th ed.", Macmillian Publishing Co., Inc., NY, Chapter 15, pp. 438-442, 1977.

The development treatment generally is carried out using an alkaline solution. The alkaline solution used in the development treatment may be mixed into the fixer (generally an acidic solution), whereby the activity of the fixer may disadvantageously be changed during the fixation treatment. Further, the developer may remain on the film after removing the film from the development bath, whereby an undesired development reaction may be accelerated by the developer. Thus, it is preferred that the photosensitive silver salt layer 66 is neutralized or acidified by a quencher such as an acetic acid (vinegar) solution after the development treatment and before the fixation treatment.

Figure 29E:
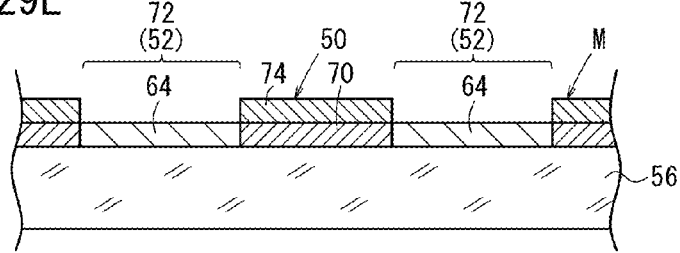

In addition, as shown in FIG. 29E, a conductive metal 74 may be disposed only on the metallic silver portions 70 by a plating treatment (such as an electroless plating treatment, an electroplating treatment, or a combination thereof), etc. In this case, the mesh pattern M is formed by the metallic silver portions 70 and the conductive metal 74 disposed on the metallic silver portions 70.

Differences between the above mentioned process using the photosensitive silver salt layer 66 (silver salt photography technology) and a process using a photoresist (resist technology) will be described below.

In resist technology, a photopolymerization initiator absorbs light in an exposure treatment to initiate a reaction, a photoresist film (a resin) per se undergoes a polymerization reaction to increase or decrease the solubility in a developer, and the resin in an exposed or unexposed area is removed in a development treatment. The developer liquid used in resist technology may be an alkaline solution free of reducing agents, in which an unreacted resin component can be dissolved. On the other hand, as described above, in silver salt photography technology according to the present invention, the minute silver nuclei, i.e., the so-called "latent image", are formed from silver ions and photoelectrons generated in the silver halide 62 exposed in the exposure treatment. The latent image silver nuclei are grown to form the visible silver image in the development treatment using the developer, which must contain the reducing agent (the developing agent). Thus, resist technology and silver salt photography technology are significantly different in terms of the reactions in the exposure and development treatments.

In the development treatment of the resist technology, the unpolymerized resin portion in the exposed or unexposed area is removed. On the other hand, in the development treatment of the silver salt photography technology, using the latent image as the catalyst core, the reduction reaction is conducted by the reducing agent contained in the developer (the developing agent), and the developed silver 68 is grown into a visible size. The gelatin 64 in the unexposed area is not removed. Thus, resist technology and silver salt photography technology are significantly different also in the reactions in the development treatments.

The silver halide 62 contained in the gelatin 64 in the unexposed area is eluted in the following fixation treatment, and the gelatin 64 itself is not removed.

In this manner, in silver salt photography technology, the main reaction component (the main photosensitive component) is the silver halide, while in resist technology, the main reaction component is the photopolymerization initiator. Further, in the development treatment, the binder (the gelatin 64) remains in silver salt photography technology, while the binder is removed in resist technology. Thus, resist technology and silver salt photography technology are significantly different concerning these points.

Figure 30A:
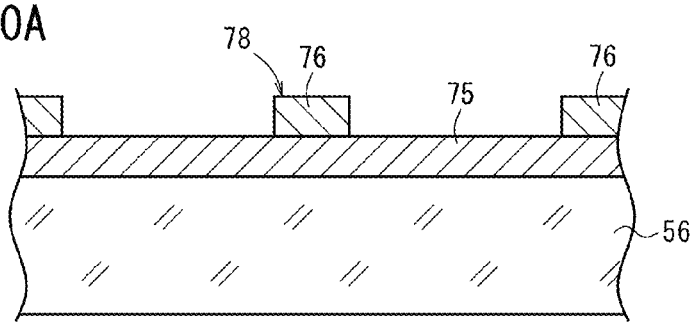
FIGS. 30A and 30B are process diagrams showing a second conductive film manufacturing method according to the present embodiment.
Figure 30B:
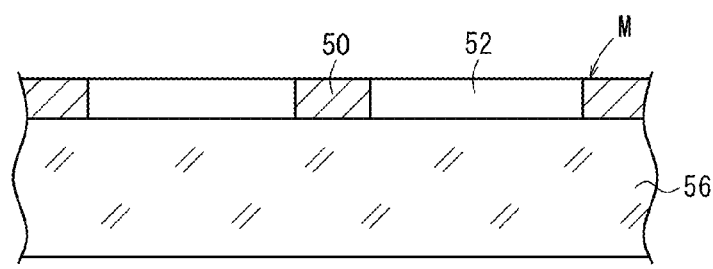

In another method (second production method), for example, as shown in FIG. 30A, a photoresist film 76 is formed on a copper foil 75 disposed on the transparent film substrate 56 in order to obtain a photosensitive material. Thereafter, exposure is carried out with respect to the photosensitive material. More specifically, the photoresist film 76 is irradiated with light via a mask pattern corresponding to an exposure pattern obtained by the pattern generation process shown in FIG. 10 or FIG. 24. Alternatively, by digital writing exposure carried out with respect to the photoresist film 76, an exposure pattern created by a pattern generating device is applied to expose the photoresist film 76. Thereafter, by means of a development treatment, a resist pattern 78 corresponding to the conductive portion 50 is formed on the transparent film substrate 56, and as shown in FIG. 30B, etching is carried out on a copper foil 75 exposed from the resist pattern 78. At this stage, the conductive portion (mesh pattern M) is formed by the copper foil 75 on the transparent film substrate 56.

Figure 31A:
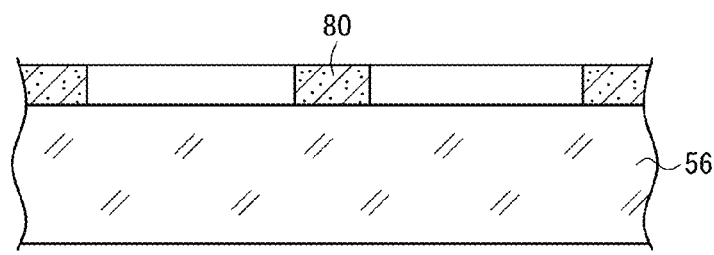
FIGS. 31A and 31B are process diagrams showing a third conductive film manufacturing method according to the present embodiment.
Figure 31B:
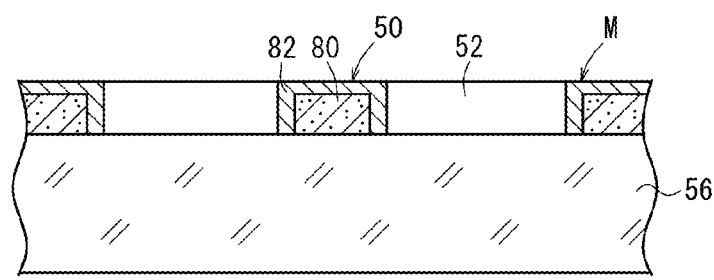

Further, in the third production method, as shown in FIG. 31A, a paste 80 containing fine metal particles is printed on the transparent film substrate 56. As shown in FIG. 31B, the printed paste 80 may be plated with a metal 82 to form the conductive portion 50 (mesh pattern M).

Figure 32:
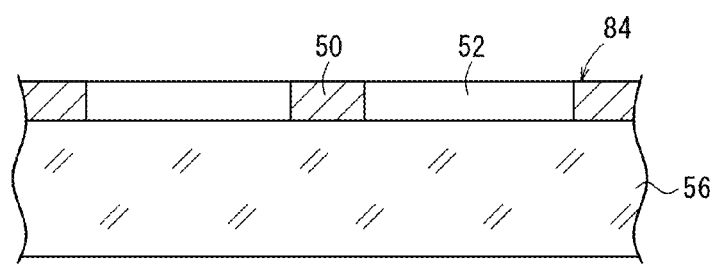
FIG. 32 is a process diagram showing a fourth conductive film manufacturing method according to the present embodiment.

Alternatively, in the fourth production method, as shown in FIG. 32, a metallic thin film 84 may be printed on the transparent film substrate 56 by using a screen or gravure printing plate to thereby form the mesh pattern M.

Next, in the conductive film 14 according to the present embodiment, a particularly preferred manufacturing method of forming a conductive metal film using a photographic photosensitive silver halide material for the conductive film 14 will mainly be described below.

As described above, the conductive film 14 according to the present embodiment may be produced as follows. A photosensitive material having the transparent film substrate 56 and thereon a photosensitive silver halide-containing emulsion layer is exposed and developed, whereby the metallic silver portions 70 and the light-transmitting portions 72 are formed respectively in the exposed areas and the unexposed areas. The metallic silver portions 70 may be subjected to a physical development treatment and/or a plating treatment to deposit the conductive metal 74 thereon.

The method for forming the conductive film 14 according to the present embodiment includes the following three processes, depending on the photosensitive materials and development treatments.

(1) A process comprising subjecting a photosensitive black-and-white silver halide material free of physical development nuclei to a chemical or physical development, to form the metallic silver portions 70 on the photosensitive material.

(2) A process comprising subjecting a photosensitive black-and-white silver halide material having a silver halide emulsion layer containing physical development nuclei to a physical development, to form the metallic silver portions 70 on the photosensitive material.

(3) A process comprising subjecting a stack of a photosensitive black-and-white silver halide material free of physical development nuclei and an image-receiving sheet having a non-photosensitive layer containing physical development nuclei to a diffusion transfer development, to form the metallic silver portions 70 on the non-photosensitive image-receiving sheet.

In process (1), an integral black-and-white development procedure is used to form a transmittable conductive film such as a transmittable electromagnetic-shielding film or a light-transmitting conductive film on the photosensitive material. The resulting silver is a chemically or physically developed silver containing a high-specific surface area filament, and thereby shows a high activity in the following plating or physical development treatment.

In process (2), the silver halide is melted around the physical development nuclei and deposited on the nuclei in the exposed areas, to form a transmittable conductive film on the photosensitive material. Also in this process, an integral black-and-white development procedure is used. Although high activity can be achieved since the silver halide is deposited on the physical development nuclei during development, the developed silver has a spherical shape with small specific surface.

In process (3), the silver halide is melted in unexposed areas, and diffused and deposited on the development nuclei of the image-receiving sheet, to form a transmittable conductive film on the sheet. In this process, a so-called separate-type procedure is used, and the image-receiving sheet is peeled off from the photosensitive material.

A negative or reversal development treatment can be used in the foregoing processes. In the diffusion transfer development, the negative development treatment can be carried out using an auto-positive photosensitive material.

The chemical development, thermal development, solution physical development, and diffusion transfer development have the meanings generally known in the art, and are explained in common photographic chemistry texts such as Shin-ichi Kikuchi, "Shashin Kagaku (Photographic Chemistry)", Kyoritsu Shuppan Co., Ltd., 1955 and C. E. K. Mees, "The Theory of Photographic Processes, 4th ed.", Mac-Millan, 1977. A liquid treatment is generally used in the present invention, and also a thermal development treatment can be utilized. For example, techniques described in Japanese Laid-Open Patent Publication Nos. 2004-184693, 2004-334077, and 2005-010752, and Japanese Patent Application Nos. 2004-244080 and 2004-085655 can be used in the present invention.

(Photosensitive Material)

A photosensitive material (photosensitive web) as a plating material, for example, is an elongate flexible substrate on which a silver salt-containing layer containing a silver salt (e.g., silver halide) is disposed on the transparent film substrate 56. Further, a protective layer may be disposed on a silver salt-containing layer. The protective layer implies a layer made up from a binder, for example, such as gelatin or a high-molecular polymer, which may be formed on the silver salt-containing layer for realizing an effect of improving mechanical characteristics or preventing abrasion. The thickness of the protective layer preferably is from 0.02 to 20 µm.

Concerning the composition or the like of the silver salt-containing layer and the protective layer, there can be appropriately applied a silver halide emulsion layer (silver salt-containing layer) and the protective layer, which may be applied to a silver halide photographic film, photographic paper, a printing plate film, an emulsion mask for a photomask or the like.

In particular, as the photosensitive material, preferably, a silver halide photographic film (silver halide photosensitive material), and more preferably, a black-and-white silver halide photographic film (black-and-white silver halide photosensitive material) is used. Further, as the silver salt applied to the silver salt-containing layer, in particular, silver halide is considered most preferable. The width of the photosensitive material, for example, is 20 cm or greater, and the thickness thereof preferably is 50 to 200 µm.

[Transparent Film Substrate 56]

A flexible plastic film can be used as the transparent film substrate 56 in the manufacturing method of the present embodiment.

As raw materials for the above-mentioned flexible plastic film, there can be used, for example, polyethylene terephthalate (PET), polyethylene naphthalate (PEN), polyolefins such as polyvinyl chloride, polyvinylidene chloride, polyvinyl butyral, polyamide, polyether, polysulfone, polyether sulfone, polycarbonate, polyarylate, polyetherimide, polyether ketone, polyether ether ketone, EVA, etc., polycarbonate, triacetyl cellulose (TAC), acrylic resin, polyimide or aramid.

In the present embodiment, from the standpoints of light-transmission, heat resistance, ease of handling, and price, preferably, the aforementioned plastic film is a polyethylene terephthalate (PET) film or a triacetyl cellulose (TAC) film.

Since transparency is a required property of a transparent heating element such as window glass or the like, preferably, the transparency of the transparent film substrate 56 is high. In this case, preferably, the total visible optical transmittance of the plastic film is 70% to 100%, more preferably, is 85% to 100%, and still more preferably, is 90% to 100%. Further, with the present invention, a colored or tinted film may be used as the plastic film insofar as the objects of the present invention are not interfered with.

The plastic film in the present embodiment can be utilized as a single layer, or can be used as a multilayer film in which two or more layers are combined.

[Protective Layer]

As for the photosensitive material that is used, the protective layer may be disposed on a later-described emulsion layer. In the present embodiment, the term "protective layer" implies a layer made up from a binder, for example, such as gelatin or a high-molecular polymer, and for realizing an effect of improving mechanical characteristics or preventing abrasion, a photosensitive emulsion layer is formed. The protective layer preferably is not applied by a plating process, and even if provided, a thin protective layer is preferable. The thickness of the protective layer preferably is 0.2 μm or less. The forming method by coating of the protective layer is not particularly limited, and any known coating method can be selected appropriately.

[Emulsion Layer]

The photosensitive material used in the production method of this embodiment preferably has the transparent film substrate 56 and thereon the emulsion layer containing the silver salt as a light sensor (the photosensitive silver salt layer 66). If needed, in addition to silver salt, the emulsion layer according to the present embodiment may contain a dye, a binder, a solvent, etc.

<Silver Salt>

The silver salt used in the present embodiment preferably is an inorganic silver salt such as a silver halide. It is particularly preferred that the silver salt is used in the form of particles for the photographic photosensitive silver halide material. Silver halide has an excellent light sensing property.

The silver halide, preferably used in the photographic emulsion of the photographic photosensitive silver halide material, will be described below.

In the present embodiment, silver halide is preferably used as a light sensor. Silver halide technologies for photographic silver salt films, photographic papers, print engraving films, emulsion masks for photomasking, and the like may be utilized in the present embodiment.

The silver halide may contain a halogen element of chlorine, bromine, iodine, or fluorine, and may contain a combination of such elements. For example, the silver halide preferably contains AgCl, AgBr, or AgI, and more preferably contains AgBr or AgCl as a principal component thereof. Also, silver chlorobromide, silver iodochlorobromide, or silver iodobromide preferably is used as the silver halide. More preferably, the silver halide is silver chlorobromide, silver bromide, silver iodochlorobromide, or silver iodobromide, and most preferably, is silver chlorobromide or silver iodochlorobromide having a silver chloride content of 50 mol % or more.

The phrase, "silver halide contains AgBr (silver bromide) as a principal component" implies that the mole ratio of bromide ions is 50% or more in the silver halide composition. Silver halide particles that contain AgBr as a principal component thereof may also contain iodide or chloride ions in addition to the bromide ions.

The silver halide emulsion used in the present embodiment may contain a metal of Group VIII or VIIB. It is particularly preferred that the silver halide emulsion contains a rhodium compound, an iridium compound, a ruthenium compound, an iron compound, an osmium compound, or the like, to obtain a gradation of 4 or more and to achieve low fogging.

Also for attaining high sensitivity, doping is advantageously employed with a hexacyano metal complex such as $K_4[Fe(CN)_6]$, $K_4[RU(CN)_6]$, or $K_3[Cr(CN)_6]$.

The added amount of the above compounds preferably is $10^{-10}$ to $10^{-2}$ mol/mol-Ag, and more preferably, is $10^{-9}$ to $10^{-3}$ mol/mol-Ag per 1 mol of silver halide.

Further, in the present embodiment, the silver halide preferably contains Pd (II) ion and/or Pd metal. Pd is preferably contained in the vicinity of the surface of the silver halide particle, although Pd may be uniformly distributed therein. Herein, the phrase "Pd is contained in the vicinity of the surface of the silver halide particle" implies that the particle has a layer with a higher palladium content in a region of 50 nm or less in the depth direction from the surface.

Such silver halide particles can be prepared by adding Pd during particle formation thereof. Preferably, Pd is added after the silver ions and the halogen ions have been added respectively at an amount of 50% or more of the total amount. It also is preferred that Pd(II) ions are added in a post-ripening process so that Pd(II) ions exist in the silver halide surface layer.

The Pd-containing silver halide particles act to accelerate physical development and non-electrolytic plating, to improve production efficiency of the desired heating element, and to lower production costs. Pd is well known and used as a non-electrolytic plating catalyst. In the present invention, since Pd can be located in the vicinity of the surface of the silver halide particles, the amount of Pd, which is quite expensive, can be reduced.

In the present embodiment, the Pd ions and/or Pd metal content with respect to the molar number of silver in the silver halide preferably is $10^{-4}$ to 0.5 mol/mol-Ag, and more preferably, is 0.01 to 0.3 mol/mol-Ag.

Examples of Pd compounds used include $PdCl_4$ and $Na_2PdCl_4$.

In the present embodiment, the sensitivity of the light sensor may be further enhanced by chemical sensitization, which is generally used for photographic emulsions. Examples of chemical sensitization methods include chalcogen sensitization methods such as sulfur, selenium, and tellurium sensitization methods, noble metal sensitization methods such as gold sensitization methods, and reduction sensitization methods, or the like. Such methods may be used singly or in combination. In the case of combining the chemical sensitization methods, preferred combinations include a combination of a sulfur sensitization method and a gold sensitization method; a combination of a sulfur sensitization method, a selenium sensitization method, and a gold sensitization method; and a combination of a sulfur sensitization method, a tellurium sensitization method, and a gold sensitization method.

<Binder>

A binder may be used in the emulsion layer to uniformly disperse the silver salt particles and to assist the emulsion layer in adhering to a support. In the present invention, the binder may contain a water-insoluble or water-soluble polymer, and preferably contains a water-soluble polymer.

Examples of the above-discussed binders include gelatins, polyvinyl alcohols (PVA), polyvinyl pyrolidones (PVP), polysaccharides such as starches, celluloses and derivatives thereof, polyethylene oxides, polysaccharides, polyvinylamines, chitosans, polylysines, polyacrylic acids, polyalginic acids, polyhyaluronic acids, and carboxycelluloses. The binders exhibit a neutral, anionic, or cationic property depending on the ionic properties of the functional group.

The amount of binder contained in the emulsion layer is not particularly limited, and can be determined suitably within a range capable of exhibiting dispersion and adhesion. For example, the amount preferably is adjusted such that the Ag/binder volume ratio of the photosensitive silver salt layer 66 is ¼ or more, and more preferably, so that the Ag/binder volume ratio is ½ or more.

<Solvent>

The solvent used for forming the aforementioned emulsion layer is not particularly limited, and examples thereof include water, organic solvents (e.g., alcohols such as methanol, ketones such as acetone, amides such as formamide, sulfoxides such as dimethyl sulfoxide, esters such as ethyl acetate, and ethers, etc.), ionic liquids, as well as mixtures of such solvents.

In the present invention, concerning the solvent used in the emulsion layer, the mass ratio of the solvent to the total of the silver salt, the binder, etc., contained in the emulsion layer is 30% to 90% by mass, and more preferably, is 50% to 80% by mass.

Next, respective processes for forming the conductive portion 50 (mesh pattern M) shall be explained.

[Exposure]

In the present embodiment, the photosensitive material having the photosensitive silver salt layer 66 disposed on the transparent film substrate 56 is subjected to an exposure treatment by the exposure unit 18. Exposure can be carried out using electromagnetic waves. For example, light such as visible light or ultraviolet light, or radiation such as X-rays or the like may be used to generate electromagnetic waves. Exposure may also be carried out using a light source having a wavelength distribution or a specific wavelength.

Exposure for forming a pattern image may be carried out using a surface exposure method or a scanning exposure method. In the surface exposure method, the photosensitive surface is irradiated with uniform light through a mask to form an image of a mask pattern. In the scanning exposure method, the photosensitive surface is scanned with a beam of laser light or the like so as to form a patterned irradiated area on the photosensitive surface.

Various types of laser beams can be used to carry out exposure. For example, in the present embodiment, scanning exposure preferably can be carried out using monochromatic high-density light of a gas laser, a light-emitting diode, a semiconductor laser, or a second harmonic generation (SHG) light source containing a nonlinear optical crystal in combination with a semiconductor laser or a solid laser using a semiconductor laser as an excitation source. Also, a KrF excimer laser, an ArF excimer laser, an F2 laser, or the like can be used to carry out exposure. To reduce the size and cost of the system, it is preferred that exposure be carried out using a semiconductor laser or a second harmonic generation (SHG) light source containing a nonlinear optical crystal in combination with a semiconductor laser or a solid laser. It is particularly preferred that exposure be carried out using a semiconductor laser, from the standpoint of reducing size and cost, and for improving durability and stability of the apparatus.

It is preferred that the photosensitive silver salt layer 66 is exposed to the pattern shape by a scanning exposure method using a laser beam. In particular, a capstan-type laser scanning exposure apparatus, as described in Japanese Laid-Open Patent Publication No. 2000-039677, is preferably used for such an exposure. In a capstan-type apparatus, a DMD as described in Japanese Laid-Open Patent Publication No. 2004-001224 preferably is used in the optical beam scanning system, instead of beam scanning by a rotary polygon mirror. Particularly in the case of producing a long flexible film heater having a length of 3 m or more, it is preferred that the photosensitive material be exposed to a laser beam on a curved exposure stage while the material is conveyed.

As described later, the mesh pattern M may be a lattice pattern of a triangle, a quadrangle (e.g., rhombus, square), a hexagon, etc., formed by crossing straight thin wires substantially parallel to each other. Furthermore, the mesh pattern M may be a pattern of straight, zigzag, or wavy wires parallel to each other. No particular limitation is placed thereon, insofar as the mesh pattern M is of a structure that enables a current to flow between electrodes to which a voltage is applied.

[Development Treatment]

In the present embodiment, after exposure of the emulsion layer, the emulsion layer is further subjected to a development treatment. The development treatment can be performed using common development treatment technologies for photographic silver salt films, photographic papers, print engraving films, emulsion masks for photomasking, and the like. Although not particularly limited, the developer for the development treatment may be a PQ developer, an MQ developer, an MAA developer, etc. Examples of commercially available developers usable in the present invention include CN-16, CR-56, CP45X, FD-3, and PAPITOL, available from FUJIFILM Corporation, and C-41, E-6, RA-4, D-19, and D-72, available from Eastman Kodak Company, as well as other developers contained in kits thereof.

The developer may be a lith developer. As one such lith developer, D85 available from Eastman Kodak Company can be used. In the present invention, by performing the aforementioned exposure and development treatments, the metallic silver portion 70, and preferably the patterned metallic silver portion 70, is formed in the exposed area, and the light-transmitting portion 72 is formed in the unexposed area.

The developer used for the development treatment can contain an image quality improvement agent for improving image quality. Examples of suitable image quality improvement agents can include, for example, nitrogen-containing heterocyclic compounds such as benzotriazole. Further, in the case of using a lith developer, preferably polyethylene glycol is used.

The ratio of the metallic silver contained in the exposed portion after development to the silver contained in this portion before exposure preferably is 50% or more, and more preferably, is 80% or more by mass. If the ratio of the silver contained in the exposed portion after development to the silver contained in this portion before exposure is 50% or more by mass, high conductivity can be achieved.

In the present embodiment, the gradation obtained by the development preferably is in excess of 4.0, although this value is not particularly limited. If the gradation is in excess of 4.0 after development, conductivity of the conductive metal portion can be increased while maintaining high transmittance of the light-transmitting portion. For example, a gradation of 4.0 or more can be achieved by doping with rhodium or iridium ion.

[Physical Development and Plating Treatment]

In the present embodiment, to increase conductivity of the metallic silver portion 70 formed by the above exposure and development treatments, conductive metal particles may be deposited on the metallic silver portions 70 by a physical development treatment and/or a plating treatment. In the present embodiment, such conductive metal particles may be deposited on the metallic silver portion 70 by only one of the physical development and plating treatments, or by a combination of such treatments.

In the present embodiment, "physical development" is defined by a process in which metal ions such as silver ions are reduced by a reducing agent, whereby the metal particles are deposited on a metal or metal compound core. Such a physical development process has been used in the fields of instant B&W film, instant slide film, printing plate production, etc., and such technologies can also be used in the present invention.

[Calendering Treatment]

A calendering treatment may be carried out to effect smoothing on the metallic silver portion 70 (i.e., the overall surface of the metallic silver portion, the metallic mesh pattern portion, or the metallic wiring pattern portion). As a result, conductivity of the metallic silver portion 70 can be markedly increased. The calendering treatment can be performed using a calender roll, wherein such a calender roll typically is made up from a pair of rolls.

As rolls that are used in the calendering process, plastic rolls of epoxy, polyimide, polyamide, polyimide amide, etc., or metallic rolls are used. In particular, in the case of using an emulsion layers on both surfaces, preferably, processing is carried out by metallic rolls per se. In the case of having an emulsion layer on one side only, from the standpoint of preventing wrinkles, a metallic roll and a plastic roll can be used together in combination. The lower limit value of linear pressure applied by the rolls is 1960 N/cm (200 kgf/cm, or 699.4 kgf/cm$^2$ if converted to surface pressure) or greater, and more preferably, is 2940 N/cm (300 kgf/cm, or 935.8 kgf/cm$^2$ if converted to surface pressure) or greater. The upper limit value of linear pressure is 6880 N/cm (700 kgf/cm) or less.

The applicable temperature at which the smoothing process represented by calender rollers is carried out preferably is within a range of 10° C. (without temperature adjustment) to 100° C., and more preferably, although it differs depending on the type of binder or the image line density and shape of the metallic mesh pattern or the metallic wiring pattern, is within a range of 10° C. (without temperature adjustment) to 50° C.

[Steam Contact Treatment]

An advantageous effect can also be brought forth by applying a steam contact treatment together with the calendering treatment immediately prior to or following the calendering treatment. More specifically, conductivity can be enhanced significantly. The temperature of the steam that is used preferably is 80° C. or greater, and more preferably, is 100° C. or higher to 140° C. or less. The contact time during which steam is applied is preferably on the order of from 10 seconds to 5 minutes, and more preferably, is from 1 minute to 5 minutes.

In the present invention, the technologies of the following Japanese Laid-Open Patent Publications and PCT International Publication Numbers shown in Tables 1 and 2 can appropriately be used in combination. In the following Tables 1 and 2, conventional notations such as "Japanese Laid-Open Patent Publication No.", "Publication No.", "Pamphlet No. WO", etc., have been omitted.

TABLE 1

| | | | | |
|---|---|---|---|---|
| 2004-221564 | 2004-221565 | 2007-200922 | 2006-352073 | 2007-129205 |
| 2007-235115 | 2007-207987 | 2006-012935 | 2006-010795 | 2006-228469 |
| 2006-332459 | 2009-21153 | 2007-226215 | 2006-261315 | 2007-072171 |
| 2007-102200 | 2006-228473 | 2006-269795 | 2006-269795 | 2006-324203 |
| 2006-228478 | 2006-228836 | 2007-009326 | 2006-336090 | 2006-336099 |
| 2006-348351 | 2007-270321 | 2007-270322 | 2007-201378 | 2007-335729 |
| 2007-134439 | 2007-149760 | 2007-208133 | 2007-178915 | 2007-334325 |
| 2007-310091 | 2007-116137 | 2007-088219 | 2007-207883 | 2007-013130 |
| 2005-302508 | 2008-218784 | 2008-227350 | 2008-227351 | 2008-244067 |
| 2008-267814 | 2008-270405 | 2008-277675 | 2008-277676 | 2008-282840 |
| 2008-283029 | 2008-288305 | 2008-288419 | 2008-300720 | 2008-300721 |
| 2009-4213 | 2009-10001 | 2009-16526 | 2009-21334 | 2009-26933 |
| 2008-147507 | 2008-159770 | 2008-159771 | 2008-171568 | 2008-198388 |
| 2008-218096 | 2008-218264 | 2008-224916 | 2008-235224 | 2008-235467 |
| 2008-241987 | 2008-251274 | 2008-251275 | 2008-252046 | 2008-277428 |

TABLE 2

| | | | | |
|---|---|---|---|---|
| 2006/001461 | 2006/088059 | 2006/098333 | 2006/098336 | 2006/098338 |
| 2006/098335 | 2006/098334 | 2007/001008 | | |

EXAMPLE

An example of the present invention will be described more specifically below. Materials, amounts, ratios, treatment contents, treatment procedures, and the like, used in the example may be appropriately changed without departing from the essential scope of the present invention. Therefore, the following specific example should be considered in all respects as illustrative and not restrictive.

[Photosensitive Silver Halide Material]

An emulsion containing an aqueous medium, gelatin, and silver iodobromochloride particles was prepared. The amount of gelatin was 10.0 g per 60 g of Ag, and the silver iodobromochloride particles had an I content of 0.2 mol %, a Br content of 40 mol %, and an average spherical equivalent diameter of 0.1 μm.

$K_3Rh_2Br_9$ and $K_2IrCl_6$ were added to the emulsion at a concentration of $10^{-7}$ mol/mol-Ag in order to dope the silver bromide particles with Rh and Ir ions. $Na_2PdCl_4$ was further added to the emulsion, and the resultant emulsion was subjected to gold-sulfur sensitization using chlorauric acid and sodium thiosulfate. The emulsion and a gelatin hardening agent were applied to polyethylene terephthalate (PET) such that the amount of the applied silver was 1 g/m$^2$. The Ag/gelatin volume ratio was ½.

The PET support body had a width of 30 cm, and the emulsion was applied thereto at a width of 25 cm and a length of 20 m. Both end portions of the PET support having a width of 3 cm were cut off in order to obtain a roll-shaped photosensitive silver halide material having a central coating width of 24 cm.

[Generation of Exposure Pattern]

Using an SA method as described for the present embodiment (see FIGS. 10 and 24, etc.), output image data ImgOut representing the first mesh pattern M1 (see FIG. 28A) and the second mesh pattern M2 (see FIG. 28B) and made up from irregularly arranged wirings were created respectively.

The set conditions for the first mesh pattern M1 and the second mesh pattern M2 were established such that the total transmittance was 93%, the thickness of the transparent film substrate 56 was 20 μm, the width of the metallic thin wires 54 was 20 μm, and the thickness of the metallic thin wires 54 was 10 μm. The pattern size was set to 5 mm both vertically and horizontally, and the image resolution was set to 3500 dpi (dots per inch). Initial positions of the seed points SD were determined randomly using a Mersenne Twister algorithm, and respective polygonal mesh areas were defined using a Voronoi diagram.

Evaluation values EVP were calculated based on the L*, a*, b* image data color values of the image data Img. In addition, the same output image data ImgOut were arranged alongside one another in both vertical and horizontal directions to create periodic exposure patterns.

On the other hand, the conditions for the black matrix 59 were set such that the optical density was 4.5 D, the unit pixel 60 had a vertical size and a horizontal size of 200 μm, and the widths of the light shielding material 61h and the light shielding material 61v were both 20 μm.

Firstly, the radio button 162b on the setting screen 160 of FIG. 6 was selected, and with "PRESENCE/ABSENCE OF MATRIX" being set to "ABSENCE", the output image data ImgOut was created. As a result, output image data ImgOut representing the form of the mesh pattern M1 shown in FIG. 28A was obtained.

Secondly, the radio button 162a on the setting screen 160 of FIG. 6 was selected, and with "PRESENCE/ABSENCE OF MATRIX" being set to "PRESENCE", the output image data ImgOut was created. As a result, output image data ImgOut representing the pattern of the mesh pattern M2 shown in FIG. 28B was obtained.

[Exposure]

Exposure was performed in a continuous exposure apparatus in which exposure heads using a DMD (Digital Mirror Device), as described in the embodiment of the invention described in Japanese Laid-Open Patent Publication No. 2004-001224, were arranged at a width of 25 cm, the exposure heads and an exposure stage were disposed in a curved position so that laser light could form an image on the photosensitive layer of the photosensitive material, a photosensitive material-delivering mechanism and a photosensitive material-winding mechanism were installed, and a bent portion was provided to exhibit a buffering action, so that variations of speed of the tension-controlling mechanism for the exposure surface and the delivering and winding mechanisms did not affect the speed of exposed portions. The wavelength of exposure light was 400 nm, the beam shape was approximately the square of 12 and the irradiation amount of the laser light source was 100 μJ.

[Formulation of Developing Solution]

The following chemical compounds were included in 1 liter of the developing solution.

| | |
|---|---|
| Hydroquinone | 20 g |
| Sodium sulfite | 50 g |
| Potassium carbonate | 40 g |
| Ethylenediaminetetraacetic acid | 2 g |
| Potassium bromide | 3 g |
| Polyethylene glycol 2000 | 1 g |
| Potassium hydroxide | 4 g |
| pH | controlled at 10.3 |

[Formulation of Fixing Solution]

The following chemical compounds were included in 1 liter of the fixing solution.

| | |
|---|---|
| Ammonium thiosulfate solution (75%) | 300 ml |
| Ammonium sulfite monohydrate | 25 g |
| 1,3-Diaminopropanetetraacetic acid | 8 g |
| Acetic acid | 5 g |
| Aqueous ammonia (27%) | 1 g |
| pH | controlled at 6.2 |

[Development Treatment]

Using the treatment agents as listed above, a development treatment was conducted on the photosensitive material following exposure thereof using an automatic development machine FG-710 PTS (manufactured by FUJIFILM Corporation) under the following development conditions; development: 30 seconds at 35° C., fixation: 23 seconds at 34° C., water washing: 20 seconds under running water (5 L/min).

As a running process, 100 m²/day of the photosensitive material was developed for 3 days while supplying 500 ml/m² of a developer replenisher, and 640 ml/m² of the fixing solution. At this time, following a plating process, the copper pattern was confirmed to have a line width of 12 μm and a pitch of 300 microns.

Further, electroless copper plating was conducted at 45° C. by using a plating solution (a electroless copper plating solution containing 0.06 mol/L of copper sulfate, 0.22 mol/L of formalin, 0.12 mol/L of triethanolamine, 100 ppm of polyethylene glycol, 50 ppm of yellow prussiate of potash and 20 ppm of α,α'-bipyridine, pH=12.5) followed by an oxidation process with an aqueous solution containing 10 ppm of Fe(III) ions, to thereby obtain various samples.

Below, the conductive film 14 having the first mesh pattern M1 is referred to as a first sample, and the conductive film 14 having the second mesh pattern M1 is referred to as a second sample. Conductive films 14 having patterns PT1 to PT3 are referred to as third through fifth samples.

[Evaluation]

(Measurement of Surface Resistivity)

To evaluate uniformity in surface resistivity, surface resistivities of the conductive films 14 were measured at ten arbitrary sites using LORESTA GP (Model MCP-T610) inline 4-pin probe type (ASP), manufactured by Dia Instruments Co., Ltd., to obtain an average value of the surface resistivities.

(Evaluation of Noise Sensation)

A commercially available color liquid crystal display (screen size: 4.7 type, 640×480 dots) was used. A touch panel on which the first and second samples were adhered was incorporated into the liquid crystal display, an LED lamp as auxiliary light was lit up from a back surface of a liquid crystal panel, the display screen was observed, and a visual evaluation of noise sensation was carried out. Visual confirmation of such noise was carried out from the front side of the liquid crystal panel at an observation distance of 300 mm.

[Results]

Ten sheets of first through fifth samples having levels sufficiently practical as transparent electrodes and in terms of surface resistivity, and with good transparency, were realized. In particular, the fourth and fifth samples (conductive film 14 according to the present invention) exhibited the lowest variance in surface resistivity.

In relation to visibility of noise, successively highest evaluation values were obtained in order of the first sample, the second sample, the fifth sample, the third sample, and the fourth sample. Such an order matches with the order in which the areas exhibited by the peaks of the spectra Spc illustrated in FIG. 18 become successively larger. In particular, it was confirmed that the sensation of noise exhibited by the first sample (conductive film 14 according to the present invention) was hardly noticeable at all.

Furthermore, using a transparent substrate instead of the liquid crystal panel, light across the aforementioned LED lamp was observed, and a similar visual evaluation was carried out, whereby it was confirmed that in the case of the first sample, the sensation of noise was considerably less noticeable than in the case of the second sample. More specifically, it was appreciated that the pattern of the mesh pattern M could be optimized responsive to the visual aspects of the conductive film 14 (e.g., color filters such as the red filters 58r or the like, and presence or absence of the black matrix 59).

In this manner, a plurality of positions (seed points SD) are selected from within a predetermined two-dimensional image region 200, and based on the selected positions (seed points SD), image data Img are created representing the pattern of a mesh pattern M, and further based on the created image data Img, an evaluation value EVP obtained by quantifying noise characteristics of the mesh pattern M is calculated. Then, based on the calculated evaluation value EVP and predetermined evaluation conditions, one of the image data Img is determined as output image data ImgOut, and based on the determined output image data ImgOut, a wire material is output and formed on the transparent film substrate 56. Therefore, the shape of a mesh pattern M having noise characteristics that satisfy the predetermined evaluation conditions can be determined. Stated otherwise, by appropriately controlling the noise characteristics of the mesh pattern M, the sensation of noise can be reduced.

Further, a mesh pattern M is formed such that, in relation to the centroid spectra Spcc of respective meshes, an average intensity $P_H$ on the side of a spatial frequency band higher than a predetermined spatial frequency Fb is made greater than an average intensity $P_L$ on the side of a spatial frequency band lower than the predetermined spatial frequency Fb. Thus, compared to the low spatial frequency band side, the amount of noise on the side of the high spatial frequency band is relatively large. Human vision exhibits a property in which the response characteristic thereof is high in low spatial frequency bands, whereas in mid to high spatial frequency bands, the response characteristic rapidly decreases, and thus, the sensation of noise as perceived visually by humans decreases. Owing thereto, granular noise caused by the pattern possessed by the conductive film 14 can be lowered, whereby visibility of objects to be observed can be significantly enhanced. Further, because a plurality of polygonal meshes are provided, the cross sectional shape of the respective wires (metallic thin wires 54) after cutting is substantially constant, and thus stable power performance is exhibited.

The present invention is not limited to the embodiment described above, but various changes and modifications may be made without departing from the scope of the invention.

The pattern material is not limited to being a black matrix, and it goes without saying that, responsive to the various uses thereof, the present invention can be applied with respect to structural patterns of various shapes.

The invention claimed is:

1. A conductive film having a mesh pattern formed by a process comprising: creating a plurality of polygonal meshes such that
   a two-dimensional power spectrum of a centroid position distribution indicating each centroid position of the polygonal meshes forming the mesh pattern is given such that, when the most intense spatial frequency is defined as a standard spatial frequency, an average intensity in a spatial frequency band higher than standard spatial frequency is greater than an average intensity in a spatial frequency band lower than the standard spatial frequency.

2. The conductive film process according to claim 1, wherein the standard spatial frequency is a spatial frequency at which a human visual response characteristic corresponds to 5% of a maximum response thereof.

3. The conductive film process according to claim 2, wherein:
   the human visual response characteristic is a visual response characteristic obtained based on a Dooley-Shaw function at a visibility distance of 300 mm; and
   the standard spatial frequency is 6 cycle/mm.

4. A conductive film having a mesh pattern formed by a process comprising: creating a plurality of polygonal meshes such that
   wherein the mesh pattern is formed such that, in relation to a power spectrum of a centroid position distribution of the meshes, an average intensity in a spatial frequency band higher than a predetermined spatial frequency which is related to the plurality of polygonal meshes is greater than an average intensity in spatial frequency band lower than the predetermined spatial frequency.

5. The conductive film process according to claim 4, wherein the predetermined spatial frequency is a spatial frequency at which a human visual response characteristic corresponds to 5% of a maximum response thereof.

6. The conductive film process according to claim 5, wherein:
   the human visual response characteristic is a visual response characteristic obtained based on a Dooley-Shaw function at a visibility distance of 300 mm; and
   the predetermined spatial frequency is 6 cycle/mn.

* * * * *